(12) United States Patent
Takaishi

(10) Patent No.: US 8,816,419 B2
(45) Date of Patent: Aug. 26, 2014

(54) SEMICONDUCTOR DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 366 days.

(21) Appl. No.: 12/665,584

(22) PCT Filed: Jun. 17, 2008

(86) PCT No.: PCT/JP2008/061020
§ 371 (c)(1),
(2), (4) Date: Dec. 18, 2009

(87) PCT Pub. No.: WO2008/156071
PCT Pub. Date: Dec. 24, 2008

(65) Prior Publication Data
US 2010/0181606 A1    Jul. 22, 2010

(30) Foreign Application Priority Data

Jun. 19, 2007 (JP) ................................. 2007-161049
Jun. 19, 2007 (JP) ................................. 2007-161052

(51) Int. Cl.
*H01L 29/94* (2006.01)

(52) U.S. Cl.
USPC ........... 257/300; 257/296; 257/297; 257/298; 257/299; 257/301; 257/302; 257/303; 257/304; 257/305; 257/306; 438/307; 438/308; 438/309; 438/310; 438/311

(58) Field of Classification Search
USPC ................................................ 257/296–312
See application file for complete search history.

(56) References Cited

U.S. PATENT DOCUMENTS

| | | | | |
|---|---|---|---|---|
| 5,679,966 A | * | 10/1997 | Baliga et al. .................. | 257/139 |
| 6,400,026 B1 | | 6/2002 | Andou et al. | |
| 6,667,515 B2 | * | 12/2003 | Inoue ............................. | 257/341 |
| 2003/0151068 A1 | * | 8/2003 | Ishibashi ....................... | 257/200 |
| 2004/0065914 A1 | * | 4/2004 | Koike et al. ................... | 257/301 |
| 2005/0167742 A1 | * | 8/2005 | Challa et al. .................. | 257/328 |
| 2006/0017100 A1 | * | 1/2006 | Bol et al. ....................... | 257/331 |
| 2006/0145230 A1 | * | 7/2006 | Omura et al. .................. | 257/302 |
| 2006/0214197 A1 | * | 9/2006 | Nakamura et al. ............ | 257/288 |
| 2010/0176443 A1 | | 7/2010 | Takaishi | |
| 2010/0193837 A1 | | 8/2010 | Takaishi | |

FOREIGN PATENT DOCUMENTS

| | | |
|---|---|---|
| JP | 2001-007149 | 1/2001 |
| JP | 2006-210535 | 8/2006 |
| JP | 2006-237066 | 9/2006 |

* cited by examiner

*Primary Examiner* — Fernando L Toledo
*Assistant Examiner* — Mohammed Shamsuzzaman
(74) *Attorney, Agent, or Firm* — Fish & Richardson P.C.

(57) ABSTRACT

Provided is a semiconductor device having a high switching speed. A semiconductor device is provided with an n-type epitaxial layer having a plurality of trenches arranged at prescribed intervals; an embedded electrode formed on an inner surface of the trench through a silicon oxide film to embed each trench; and a metal layer, which is capacitively coupled with the embedded electrode by being arranged above the embedded electrode through a silicon oxide film. In the semiconductor device, a region between the adjacent trenches operates as a channel (current path). A current flowing in the channel is interrupted by covering the region with a depletion layer formed at the periphery of the trenches, and the current is permitted to flow through the channel by eliminating the depletion layer at the periphery of the trenches.

8 Claims, 23 Drawing Sheets

$C_{iss} = C_{GS} + C_{GD}$

SEMICONDUCTOR DEVICE

TECHNICAL FIELD

The present invention relates to a semiconductor device, and more particularly to a semiconductor device having a switching function.

BACKGROUND ART

Conventionally, as semiconductor devices having a switching function, MOSFETs (metal oxide semiconductor field-effect transistors) are known (e.g., see Patent Document 1 listed below). Patent Document 1 discloses a trench-gate type MOSFET (semiconductor device) having a gate electrode buried in a trench formed in a semiconductor layer of one conductivity type.

FIG. 33 is a sectional view showing the structure of the conventional MOSFET (semiconductor device) disclosed in Patent Document 1 mentioned above. Referring to FIG. 33, in the conventional MOSFET, on the top face of an $n^+$ type semiconductor substrate 501, an epitaxial layer 502 is formed. In the epitaxial layer 502, there are formed, in order from the semiconductor substrate 501 side, an $n^-$ type doped region (drain region) 502a, a p type doped region 502b, and $n^+$ type doped region (source region) 502c.

In the epitaxial layer 502, a trench 503 is formed which penetrates through the $n^+$ type doped region 502c, through the p type doped region 502b, and halfway through then type doped region 502a down to a depth somewhere within its depth. Inside the trench 503, a gate electrode 505 is formed, with a gate insulation film 504 interposed in between. In a predetermined region on the top face of the epitaxial layer 502, an interlayer insulation film 506 is formed which stops the opening of the trench 503.

On the top face of the epitaxial layer 502, a source electrode 507 is formed so as to cover the interlayer insulation film 506. On the back (bottom) face of the semiconductor substrate 501, a drain electrode 508 is formed. It is to be noted that capacitors are parasitically formed, one between the gate electrode 505 and the source electrode 507 and another between the gate electrode 505 and the drain region 502a.

In the conventional semiconductor device configured as described above, on/off control is achieved by varying the voltage applied to the gate electrode 505. Specifically, when a predetermined positive potential is applied to the gate electrode 505, the minority carriers (electrons) in the p type doped region 502b are attracted toward the trench 503, and as a result an inversion layer 509 is formed so as to connect the $n^-$ type doped region (drain region) 502a and the $n^+$ type doped region (source region) 502c together. This enables a current to pass through the inversion layer 509 between the source electrode 507 and the drain electrode 508. Consequently, the MOSFET goes into an ON state. In this way, in the conventional MOSFET, the inversion layer 509 that is formed so as to connect then type doped region (drain region) 502a and the $n^+$ type doped region (source region) 502c together is utilized to function as a channel.

On the other hand, when the predetermined positive potential stops being applied to the gate electrode 505, the inversion layer (channel) 509 disappears, and this permits the current between the source electrode 507 and the drain electrode 508 to be cut off. Consequently, the MOSFET goes into an OFF state.

Patent Document 1: JP-A-2001-7149.

DISCLOSURE OF THE INVENTION

Problems to be Solved by the Invention

Here, in a case where capacitors are formed between the gate electrode 505 and the source electrode 507 and between the gate electrode 505 and the drain region 502a, when the MOSFET (semiconductor device) is turned on and off by controlling the voltage applied to the gate electrode 505, simultaneously those capacitors are charged and discharged. Thus, the on/off switching speed (switching speed) is slackened by, and as much as, the time required to charge and discharge the capacitors. To quicken the on/off switching speed, the time required to charge and discharge the capacitors needs to be shortened; that is, the capacitance (input capacitance) of the capacitors needs to be reduced.

Inconveniently, however, in the conventional MOSFET shown in FIG. 33, since the capacitors formed between the gate electrode 505 and the source electrode 507 and between the gate electrode 505 and the drain region 502a are parasitically formed capacitors, their capacitance is difficult to reduce. This results in the disadvantage that the switching speed is difficult to quicken.

The present invention has been devised to solve problems as discussed above, and an object of the invention is to provide a semiconductor device which permits quickening of switching speed.

Means for Solving the Problem

To achieve the above object, according to a first aspect of the invention, a semiconductor device comprises: a semiconductor layer of one conductivity type having a plurality of trenches arranged at a predetermined interval from one another; a plurality of buried electrodes buried in the plurality of trenches respectively; and a conductor layer formed inside at least one of the plurality of trenches, the conductor layer being arranged above the buried electrodes with a first insulation film interposed in between so as to be capacitively coupled to the buried electrodes. It is to be understood that, according to the invention, the semiconductor layer includes a silicon substrate.

In the semiconductor device according to the first aspect, as described above, inside the trenches, the conductor layer formed above the buried electrodes with the second insulation film interposed in between and capacitively coupled to the buried electrodes is formed, and in this way capacitors connected in series with the buried electrodes can be formed inside the trenches. This makes it possible to reduce the total capacitance (input capacitance) of the buried electrodes inside the trenches. Thus, by controlling the voltage applied to the buried electrodes, it is possible to quicken the on/off switching speed at the time of switching from an off state to an on state and switching in the opposite direction. That is, it is possible to quicken the switching speed.

In the above-described semiconductor device according to the first aspect, preferably, the semiconductor layer is configured such that the regions between mutually adjacent ones of the trenches serve as current passages respectively; when depletion layers are formed around the plurality of trenches, the regions between the mutually adjacent ones of the trenches are thereby stopped and the current passages are cut off; and when at least part of the depletion layers formed around the trenches disappear, the current passages are opened. By applying this configuration to the above-described semiconductor device according to the first aspect, it is possible to obtain a semiconductor device based on a novel operation principle which permits quickening of the switching speed and a great reduction in the on-state resistance. Specifically, when the buried electrodes are formed on the interior surface of the trenches with an insulation film interposed in between, how the depletion layers formed around the trenches are formed varies according to the voltage applied to the buried electrodes; thus, by controlling the voltage applied to the buried electrodes, it is possible to switch from an off state (a state in which the current passing through the channels is cut off) to an on state (a state in which a current flows through the channels), and to switch in the opposite direction. That is, it is possible to give the semiconductor device a switching function. With the configuration described above, in an on state, all the regions between mutually adjacent trenches where no depletion layer is formed can be utilized to function as channels (current passages), and accordingly, compared with conventional semiconductor switching devices (MOSFETs) in which a very thin inversion layer is utilized to function as a channel (current passage), it is possible to greatly reduce the resistance to the current passing through the channels. Thus, it is possible, while quickening the switching speed, to greatly reduce the on-state resistance compared with conventional semiconductor switching devices (MOSFETs).

In the above-described semiconductor device according to the first aspect, preferably, the conductor layer is formed inside each of the plurality of trenches and is capacitively coupled to the buried electrodes respectively. With this configuration, it is possible to reduce the total capacitance (input capacitance) of the individual buried electrodes, and thus it is possible to easily quicken the switching speed.

In the above-described semiconductor device according to the first aspect, a second insulation film may be formed on the top face of the conductor layer, and the second insulation film may be formed inside the trenches such that the top face of the second insulation film is flush with the top face of the semiconductor layer.

In the above-described semiconductor device according to the first aspect, preferably, a predetermined one of the plurality of buried electrodes is formed on the interior surface of the trenches with a third insulation film interposed in between, and the thickness of the first insulation film is equal to or larger than the thickness of the third insulation film. With this configuration, it is possible to suppress dielectric breakdown in the first insulation film; thus, even when the conductor layer is formed inside the trenches with the first insulation film interposed in between, it is possible to suppress the inconvenience of the semiconductor device having lower withstand voltage characteristics resulting from dielectric breakdown in the first insulation film.

In the above-described semiconductor device according to the first aspect, preferably, the width of the conductor layer in the direction of arrangement of the trenches is smaller than the width of the buried electrodes. With this configuration, it is possible to reduce the planer area of the conductor layer, and thus to reduce the capacitance between the buried electrodes and the conductor layer. Thus, it is possible to easily reduce the total capacitance (input capacitance) of the buried electrodes inside the trenches.

In the above-described semiconductor device according to the first aspect, preferably, the conductor layer is formed of a metal material. With this configuration, it is possible to easily form the conductor layer inside the trenches, and thus it is possible to easily form capacitors connected in series with the buried electrodes buried inside the trenches.

In the above-described semiconductor device according to the first aspect, preferably, the conductor layer is formed of at least one metal material selected from the group of W, Ti, and TiN. With this configuration, it is possible to more easily form the conductor layer inside the trenches, and thus it is possible to more easily form capacitors connected in series with the buried electrodes buried inside the trenches.

In the above-described semiconductor device according to the first aspect, the plurality of trenches may be formed each in an elongate shape so as to extend parallel to one another in a direction parallel to the top face of the semiconductor layer and perpendicular to the direction of arrangement of the trenches.

The above-described semiconductor device so configured that the regions between mutually adjacent trenches serve as current passages may be configured in the following manner: the current passages are cut off as a result of all the depletion layers formed around the plurality of, trenches respectively stopping the regions between the mutually adjacent ones of the trenches; and the current passages are opened as a result of all the depletion layers formed around the plurality of trenches respectively disappearing.

The above-described semiconductor device so configured that the regions between mutually adjacent trenches serve as current passages may be configured in the following manner: the plurality of buried electrodes are grouped into two types, namely first buried electrodes and second buried electrodes to which separate voltages are applied; the current passages are cut off as a result of the depletion layers formed around, of the plurality of trenches, all the trenches stopping the regions between the mutually adjacent ones of the trenches; and the current passages are opened as a result of the depletion layers formed around, of the plurality of trenches, the trenches having the first buried electrodes buried therein disappearing.

In this case, the second buried electrodes may make Schottky contact with the semiconductor layer inside the trenches.

The above-described semiconductor device so configured that the regions between mutually adjacent trenches serve as current passages may be configured in the following manner: there are further provided diffusion regions of the opposite conductivity type formed respectively in the regions between the mutually adjacent ones of the trenches in the semiconductor layer and arranged at a predetermined interval from the trenches; the current passages are cut off as a result of the depletion layers formed around the trenches and the diffusion regions respectively stopping the regions between the mutually adjacent ones of the trenches; and the current passages are opened as a result of the depletion layers formed around the trenches respectively disappearing.

According to a second aspect of the invention, a semiconductor device comprises: a semiconductor layer of one conductivity type having a plurality of trenches arranged at a predetermined interval from one another; a plurality of buried electrodes buried inside the plurality of trenches; and a capacitor formed in a predetermined region on the semiconductor layer with an insulation/separation layer interposed in between, the capacitor at least including a fourth insulation film, a first electrode, and a second electrode, the fourth insulation film being laid between the first and second electrodes. Here, the capacitor and the buried electrodes are electrically connected together, and a voltage is applied to the buried electrodes via the capacitor. It is to be understood that, according to the invention, the semiconductor layer includes a silicon substrate.

In the semiconductor device according to the second aspect, as described above, a capacitor is formed in a predetermined region on the semiconductor layer, and a voltage is applied to the buried electrodes via the capacitor. With this configuration, the capacitor is connected in series with the buried electrodes, and this makes it possible to reduce the total capacitance (input capacitance) of the buried electrodes. Thus, by controlling the voltage applied to the buried electrodes, it is possible to quicken the on/off switching speed at the time of switching from an off state to an on state and switching in the opposite direction. That is, it is possible to quicken the switching speed.

In the above-described semiconductor device according to the second aspect, preferably, the semiconductor layer is configured such that the regions between mutually adjacent ones of the trenches serve as current passages respectively; when depletion layers are formed around the plurality of trenches, the regions between the mutually adjacent ones of the trenches are thereby stopped and the current passages are cut off; and, when at least part of the depletion layers formed around the trenches disappear, the current passages are opened. By applying this configuration to the above-described semiconductor device according to the second aspect, it is possible to obtain a semiconductor device based on a novel operation principle which permits quickening of the switching speed and a great reduction in the on-state resistance. Specifically, when the buried electrodes are formed on the interior surface of the trenches with an insulation film interposed in between, how the depletion layers formed around the trenches are formed varies according to the voltage applied to the buried electrodes; thus, by controlling the voltage applied to the buried electrodes, it is possible to switch from an off state (a state in which the current passing through the channels is cut off) to an on state (a state in which a current flows through the channels), and to switch in the opposite direction. That is, it is possible to give the semiconductor device a switching function. With the configuration described above, in an on state, all the regions between mutually adjacent trenches where no depletion layer is formed can be utilized to function as channels (current passages), and accordingly, compared with conventional semiconductor switching devices (MOSFETs) in which a very thin inversion layer is utilized to function as a channel (current passage), it is possible to greatly reduce the resistance to the current passing through the channels. Thus, it is possible, while quickening the switching speed, to greatly reduce the on-state resistance compared with conventional semiconductor switching devices (MOSFETs).

In the above-described semiconductor device according to the second aspect, the capacitor can be formed in a region in a peripheral part on the semiconductor layer.

In the above-described semiconductor device according to the second aspect, preferably, the first and second electrodes are each formed of polysilicon made conductive. With this configuration, it is possible to easily form the first and second electrodes on the top face of the semiconductor layer, and thus it is possible to easily form the capacitor composed of the fourth insulation film laid between the first and second electrodes on the top face of the semiconductor layer.

In the above-described semiconductor device according to the second aspect, there may be further provided an interlayer insulation film formed on the top face of the buried electrodes, and the interlayer insulation film may be formed inside the trenches such that the top face of the interlayer insulation film is flush with the top face of the semiconductor layer.

In the above-described semiconductor device according to the second aspect, preferably, a predetermined one of the plurality of buried electrodes is formed on the interior surface of the trenches with a fifth insulation film interposed in between, and the thickness of the fourth insulation film is equal to or larger than the thickness of the fifth insulation film.

With this configuration, it is possible to suppress dielectric breakdown in the fourth insulation film; thus, even when the capacitor is formed by the fourth insulation film laid between the first and second electrodes, it is possible to suppress the inconvenience of the semiconductor device having lower withstand voltage characteristics resulting from dielectric breakdown in the fourth insulation film.

In the above-described semiconductor device according to the second aspect, the plurality of trenches can be formed each in an elongate shape so as to extend parallel to one another in a direction parallel to the top face of the semiconductor layer and crossing the direction of arrangement of the trenches.

The above-described semiconductor device so configured that the regions between mutually adjacent trenches serve as current passages may be configured in the following manner: the current passages are cut off as a result of all the depletion layers formed around the plurality of trenches respectively stopping the regions between the mutually adjacent ones of the trenches; and the current passages are opened as a result of all the depletion layers formed around the plurality of trenches respectively disappearing.

The above-described semiconductor device so configured that the regions between mutually adjacent trenches serve as current passages may be configured in the following manner: the plurality of buried electrodes are grouped into two types, namely first buried electrodes and second buried electrodes to which separate voltages are applied; the current passages are cut off as a result of the depletion layers formed around, of the plurality of trenches, all the trenches stopping the regions between the mutually adjacent ones of the trenches; and the current passages are opened as a result of the depletion layers formed around, of the plurality of trenches, the trenches having the first buried electrodes buried therein disappearing.

In this case, the second buried electrodes may make Schottky contact with the semiconductor layer inside the trenches.

The above-described semiconductor device so configured that the regions between mutually adjacent trenches serve as current passages may be configured in the following manner: there are further provided diffusion regions of the opposite conductivity type formed respectively in the regions between the mutually adjacent ones of the trenches in the semiconductor layer and arranged at a predetermined interval from the trenches; the current passages are cut off as a result of the depletion layers formed around the trenches and the diffusion regions respectively stopping the regions between the mutually adjacent ones of the trenches; and the current passages are opened as a result of the depletion layers formed around the trenches respectively disappearing.

Advantages of the Invention

As described according to the present invention, it is possible to easily obtain a semiconductor device that permits quickening of the switching speed.

Figure 1:
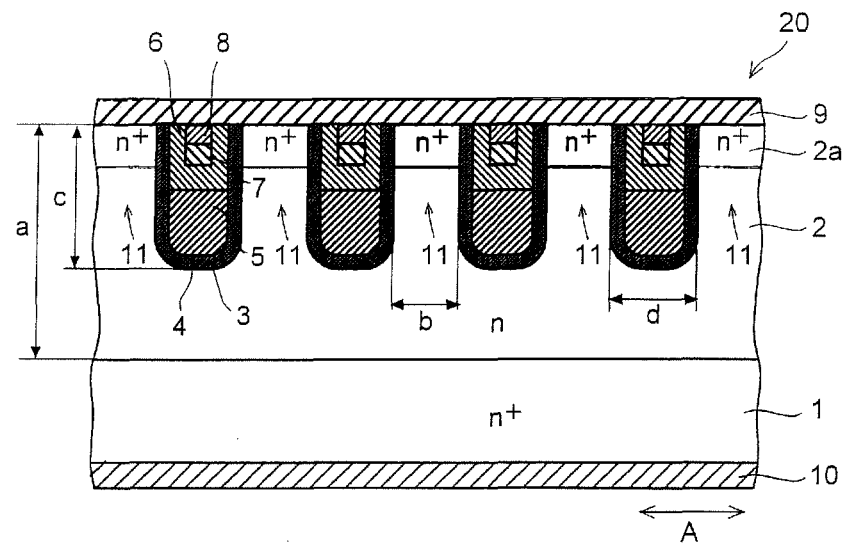
FIG. 1 A sectional view showing the structure of a semiconductor device according to a first embodiment of the invention.

LIST OF REFERENCE SYMBOLS 1, 101 n$^+$ type silicon substrate (silicon substrate of one conductivity type)
2, 102 n type epitaxial layer (silicon substrate of one conductivity type)
102a high-concentration region
3, 3a, 3b, 3c
103, 103a, 103b, 103c trench
4 silicon oxide film (third insulation film)
104 silicon oxide film (fifth insulation film)
5, 105 buried electrode
5a, 105a buried electrode (first buried electrode)
5b, 105b buried electrode (second buried electrode)
6 silicon oxide film (first insulation film)
106 interlayer insulation film
7 metal layer (conductor layer)
8, 8a, 8b interlayer insulation film (second insulation film)
9, 41, 107, 141 source electrode
109 pad electrode
109a bonding portion
10, 108 drain electrode
110 capacitor
110a dielectric layer (fourth insulation film)
110b lower electrode layer (first electrode)
110c upper electrode layer (second electrode)
111 insulation/separation film
11, 31, 42, 52
112, 131, 142, 152 channel (current passage)
12, 12a, 12b, 12c, 12d
113, 113a, 113b, 113c
113d depletion layer
13 inversion layer
20, 30, 40, 50, 60
120, 130, 140, 150 semiconductor device
41a, 141a buried portion (second buried electrode)

51, 151 p⁺ type diffusion region (diffusion region of the opposite conductivity type)

BEST MODE FOR CARRYING OUT THE INVENTION

Hereinafter, as specific examples of how the present invention is carried out, embodiments of the invention will be described in detail with reference to the accompanying drawings.

First Embodiment

FIG. 1 is a sectional view showing the structure of a semiconductor device according to a first embodiment of the invention. First, with reference to FIG. 1, the structure of the semiconductor device 20 according to the first embodiment of the invention will be described. It is to be noted that the semiconductor device 20 according to the first embodiment is configured to function as a normally-off type switching device.

In the semiconductor device 20 according to the first embodiment, on the top face of an n⁺ type silicon substrate 1, an n type epitaxial layer 2 of n type silicon with a thickness (a) of about 1 μm to about 10 μm is formed. The n⁺ type silicon substrate 1 is doped with an n type dopant at a high concentration, to form a good ohmic contact with a drain electrode 10, which will be described later. The n type epitaxial layer 2 is doped with an n type dopant at a lower concentration (e.g., about $5 \times 10^{15}$ cm⁻³ to about $1.0 \times 10^{18}$ cm⁻³) than the n⁺ type silicon substrate 1. It is to be understood that the n type epitaxial layer 2 is an example of a "semiconductor layer of one conductivity type" according to the invention.

The n type epitaxial layer 2 has a plurality of trenches 3 dug in its thickness direction. The plurality of trenches 3 are formed as a result of predetermined regions of the n type epitaxial layer 2 being etched from above its top face (main surface). Thus, the plurality of trenches 3 have their respective open sides located at the top face of the n type epitaxial layer 2.

The plurality of trenches 3 are formed each in an elongate shape so as to extend in a predetermined direction parallel to the top face of the n type epitaxial layer 2. The plurality of trenches 3 are arranged at an interval (b) of about 0.05 μm to about 0.3 μm from one another in a direction (direction A) parallel to the top face of the n type epitaxial layer 2 and perpendicular to the direction in which the trenches 3 extend. The plurality of trenches 3 are each given a depth (c) of about 0.5 μm to about 5 μm so that their depth is smaller than the depth (a) of the n type epitaxial layer 2. The plurality of trenches 3 are each given a width (d) of about 0.1 μm to about 1 μm in direction A.

On the interior surface of each of the plurality of trenches 3, by applying thermal oxidation to the n type silicon forming the n type epitaxial layer 2, a silicon oxide film 4 with a thickness of about 10 nm to about 100 nm is formed. It is to be understood that the silicon oxide film 4 is an example of a "third insulation film" according to the invention.

On the interior surface of each of the plurality of trenches 3, with the silicon oxide film 4 interposed, a buried electrode (gate electrode) 5 of p type polysilicon is formed. Each of a plurality of such buried electrodes (gate electrodes) 5 is buried to fill the corresponding trench 3 halfway up to a depth somewhere within its depth. It is to be understood that, throughout the present specification and the appended claims, "halfway" means "anywhere along the given distance (depth)" without limitation to, but not excluding, exact or close equidistance from the ends.

In the first embodiment, a plurality of buried electrodes (gate electrodes) 5 as described above are provided; thus, by controlling the voltage applied to the plurality of buried electrodes (gate electrodes) 5, it is possible to form depletion layers around a plurality of trenches 3 respectively and to make the so formed depletion layers disappear. In the first embodiment, the interval (b) between mutually adjacent trenches 3 is so set that, when depletion layers are formed around the plurality of trenches 3 respectively, the depletion layers formed around mutually adjacent trenches 3 partly overlap with each other. That is, when depletion layers are formed around the trenches 3 respectively, the depletion layers formed around mutually adjacent trenches 3 are joined together. Thus, in the first embodiment, by forming depletion layers around the plurality of trenches 3 respectively, it is possible to stop the regions between mutually adjacent trenches 3 with depletion layers respectively.

In the first embodiment, in each of the plurality of trenches 3, above the buried electrode (gate electrode) 5, a metal layer 7 of W (tungsten) is formed, with a silicon oxide film 6 interposed in between. The metal layer 7 is so formed that its width in direction A is smaller than the width of the buried electrode (gate electrode) 5 in direction A, and is arranged inside the trench 3 so as to face the buried electrode (gate electrode) 5. On the other hand, in a predetermined region on the top face of the n type epitaxial layer 2, an unillustrated gate pad electrode is formed. The metal layer 7 provided inside each of the plurality of trenches 3 is electrically connected, via an unillustrated conductor layer, to the gate pad electrode (unillustrated). Thus, the metal layer 7 is capacitively coupled to the buried electrode (gate electrode) 5. As a result, inside each of the plurality of trenches 3, the metal layer 7 and the buried electrode (gate electrode) 5 form a capacitor having the silicon oxide film 6 as a dielectric layer, in series with the buried electrode (gate electrode) 5.

In the first embodiment, inside the plurality of trenches 3 respectively, the metal layers 7 capacitively coupled to the buried electrodes (gate electrodes) 5 are provided, and this makes it possible to greatly reduce the gate input capacitance. Specifically, with the buried electrodes (gate electrodes) 5 and the metal layers 7 capacitively coupled together, in a state where the buried electrodes (gate electrodes) 5 and the capacitors are connected in series with each other, the total capacitance (gate input capacitance C) of the buried electrodes (gate electrodes) 5 is given by formula (1) below.

(Formula 1)

$$C = \frac{1}{\frac{1}{C_{GM}} + \frac{1}{C_G}} = \frac{C_{GM} \times C_G}{C_{GM} + C_G} (\text{pF}) \quad (1)$$

Here, $C_{GM}$ represents the capacitance of the capacitors formed by the buried electrodes (gate electrodes) 5 and the metal layers 7, and $C_G$ represents the capacitance of the capacitors parasitically formed at the buried electrodes (gate electrodes) 5.

As a specific numerical example, in a case where $C_G$ is 2000 pF and $C_{GM}$ is 100 pF, formula (1) above gives about 95 pF as the total capacitance (gate input capacitance C) of the buried electrodes (gate electrodes) 5. In this way, by capacitively coupling the metal layers 7 and the buried electrodes (gate electrodes) 5 together, it is possible to greatly reduce the gate input capacitance. It is to be noted that formula (1) above shows that the lower the capacitance $C_{GM}$ of the capacitors formed by the buried electrodes (gate electrodes) 5 and the metal layers 7, the lower the total capacitance C of the buried electrodes (gate electrodes) 5.

In the first embodiment, the silicon oxide film 6 is formed with a thickness equal to or larger than the thickness of the silicon oxide film 4. It is to be understood that the silicon oxide film 6 is an example of a "first insulation film" according to the invention, and that the metal layer 7 is an example of a "conductor layer" according to the invention.

In each of the plurality of trench 3, in a part above the metal layer 7, an interlayer insulation film 8 of $SiO_2$ is formed. The top face of each interlayer insulation film 8 is flush with the top face of the n type epitaxial layer 2 (the top face of a top-end part of the regions between mutually adjacent trenches 3). It is to be understood that the interlayer insulation film 8 is an example of a "second insulation film."

In a top-face part of the n type epitaxial layer 2 (a top-end part of the regions between mutually adjacent trenches 3), a high-concentration region 2a is formed which is ion-injected with an n type dopant at a high concentration so that no low-concentration region is exposed at the top face of the n type epitaxial layer 2. The dopant concentration in the high-concentration region 2a of the n type epitaxial layer 2 is so set as to form a good ohmic contact with a source electrode 9, which will be described later, and is higher than the dopant concentration in the other part of the n type epitaxial layer 2.

On the top face of the n type epitaxial layer 2, an Al layer is formed as a source electrode 9 so as to cover the open sides of the plurality of trenches 3 respectively. The source electrode 9 makes ohmic contact with the high-concentration region 2a of the n type epitaxial layer 2 (a top-end part of the regions between mutually adjacent trenches 3). On the back (bottom) face of the $n^+$ type silicon substrate 1, a multiple-layer structure having a plurality of metal layers laid together is formed as a drain electrode 10. The drain electrode 10 makes ohmic contact with the $n^+$ type silicon substrate 1.

In the configuration described above, when a voltage is applied between the source electrode 9 and the drain electrode 10, the current passing between the source electrode 9 and the drain electrode 10 (the current passing in the thickness direction of the n type epitaxial layer 2) passes through the regions between mutually adjacent trenches 3 in the n type epitaxial layer 2. That is, in the configuration described above, the regions between mutually adjacent trenches 3 in the n type epitaxial layer 2 function as channels (current passages) 11 respectively.

Figure 2:
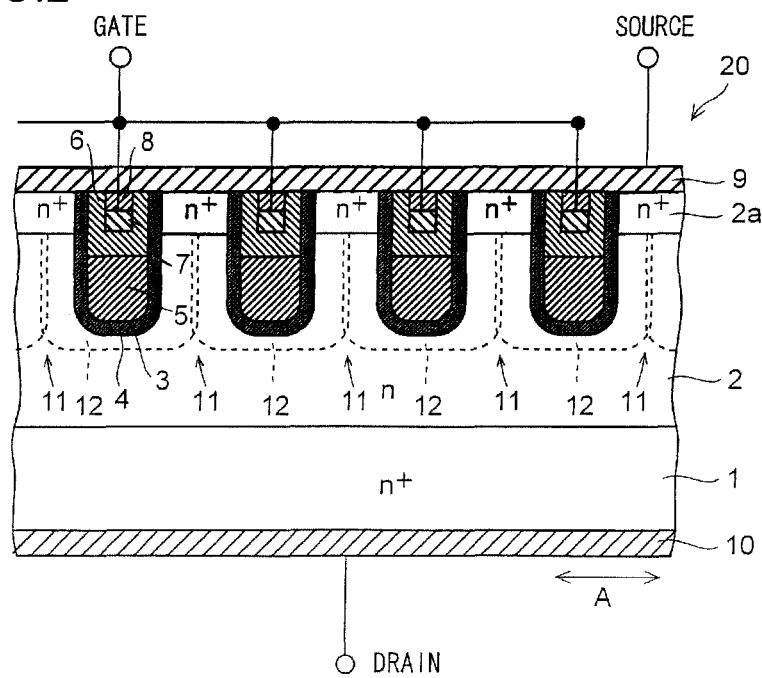
FIG. 2 A sectional view in illustration of the operation of the semiconductor device according to the first embodiment of the invention.
Figure 3:
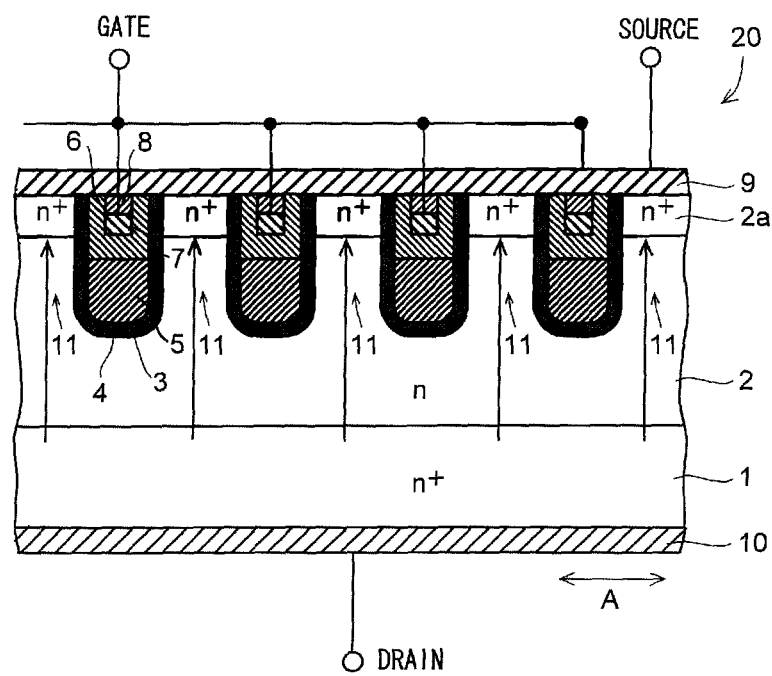
FIG. 3 A sectional view in illustration of the operation of the semiconductor device according to the first embodiment of the invention.

FIGS. 2 and 3 are diagrams in illustration of the operation of the semiconductor device according to the first embodiment of the invention. FIG. 2 shows the semiconductor device functioning as a switching device in an off state, and FIG. 3 shows the semiconductor device functioning as a switching device in an on state. Next, with reference to FIGS. 2 and 3, the operation of the semiconductor device 20 functioning as a switching device according to the first embodiment will be described.

In the following description, it is assumed that a negative potential is applied to the source electrode 9, and that a positive potential is applied to the drain electrode 10. Thus, when the semiconductor device 20 functioning as a switching device is in an on state, a current passes from the drain electrode 10 to the source electrode 9 (in the direction indicated by arrows in FIG. 3).

When the semiconductor device 20 functioning as a switching device is in an off state, as shown in FIG. 2, the voltage applied to the buried electrodes (gate electrodes) 5 is so controlled as to reduce the number of majority carriers present around the trenches 3 having the buried electrodes (gate electrodes) 5 buried in them. Here, since the metal layers 7 and the buried electrodes (gate electrodes) 5 are capacitively coupled together, the control of the voltage applied to the buried electrodes (gate electrodes) 5 is achieved by controlling the voltage applied to the metal layers 7. As a result, depletion layers 12 are formed around the trenches 3.

At this time, in the regions between mutually adjacent trenches 3, the depletion layers 12 formed around mutually adjacent trenches 3 partly overlap with each other. That is, in the regions between mutually adjacent trenches 3, the depletion layers 12 formed around mutually adjacent trenches 3 are joined together. Thus, the channels 11 are stopped by the depletion layers 12, and consequently the current passing through the channels 11 is cut off. Accordingly, the semiconductor device 20 functioning as a switching device goes into an off state.

To switch the semiconductor device 20 functioning as a switching device from an off state to an on state, as shown in FIG. 3, a predetermined positive potential (predetermined voltage) is applied to the buried electrodes (gate electrodes) 5 (the metal layers 7) to make the depletion layers 12 (see FIG. 2) formed around the trenches 3 disappear. This enables a current to pass through the channels 11, and in this way the semiconductor device 20 functioning as a switching device can be brought into an on state.

On the other hand, to switch the semiconductor device 20 functioning as a switching device from an on state to an off state, the predetermined positive potential (predetermined voltage) stops being applied to the buried electrodes (gate electrodes) 5 (the metal layers 7). This restores the state shown in FIG. 2, and in this way the semiconductor device 20 functioning as a switching device can be brought into an off state.

In the first embodiment, as described above, the metal layers 7 capacitively coupled to the buried electrodes (gate electrodes) 5 are formed inside the plurality of trenches 3 respectively; in this way, capacitors connected in series with the buried electrodes (gate electrodes) 5 can be formed inside the plurality of trenches 3 respectively. Thus, it is possible to reduce the total capacitance (gate input capacitance) of the buried electrodes (gate electrodes) 5 inside the plurality of trenches 3 respectively. As a result, by controlling the voltage applied to the buried electrodes (gate electrodes) 5, it is possible to quicken the on/off switching speed at the time of switching from an off state to an on state and switching in the opposite direction. That is, it is possible to quicken the switching speed. Moreover, since it is possible to reduce the total capacitance (gate input capacitance) of the buried electrodes (gate electrodes) 5, it is possible to raise the threshold voltage of the buried electrodes (gate electrodes) 5.

In the first embodiment, when the channels 11 (the regions between mutually adjacent trenches 3) are stopped by all the depletion layers 12 formed around the plurality of trenches 3 respectively, the current passing through the channels 11 (the regions between mutually adjacent trenches 3) is cut off; on the other hand, when all the depletion layers 12 formed around the plurality of trenches 3 respectively are made to disappear, a current passes through the channels 11 (the regions between mutually adjacent trenches 3). With this configuration, how the depletion layers 12 formed around the trenches 3 are formed varies according to the voltage applied to the buried electrodes (gate electrodes) 5; thus, by controlling the voltage applied to the buried electrodes (gate electrodes) 5, it is possible to switch from an off state (a state in which the current passing through the channels 11 is cut off)

to an on state (a state in which a current flows through the channels 11), and to switch in the opposite direction. That is, it is possible to give the semiconductor device 20 a switching function. With the configuration described above, in an on state, all the parts where the depletion layers 12 in the regions between mutually adjacent trenches 3 have disappeared can be utilized to function as channels (current passages) 11, and accordingly, compared with conventional semiconductor switching devices (MOSFETs) in which a very thin inversion layer is utilized to function as a channel (current passage), it is possible to greatly reduce the resistance to the current passing through the channels 11. Thus, it is possible, while quickening the switching speed, to greatly reduce the on-state resistance compared with conventional semiconductor switching devices (MOSFETs).

In the first embodiment, the interlayer insulation films 8 are formed on the top face of the metal layers 7, and are formed inside the trenches 3 respectively so that the top face of the interlayer insulation films 8 is flush with the top face of the n type epitaxial layer 2; in this way, between the interlayer insulation films 8 formed in mutually adjacent trenches 3, the interlayer insulation film 8 formed in one trench 3 can be prevented from making contact with the interlayer insulation film 8 formed in the next trench 3. Thus, it is possible to set the interval (b) between mutually adjacent trenches 3 easily so that, when depletion layers 12 are formed around the plurality of trench 3 respectively, the depletion layers 12 formed around mutually adjacent trenches 3 partly overlap with each other.

In the first embodiment, the thickness of the silicon oxide film 6 is made equal to or larger than the thickness of the silicon oxide film 4. With this configuration, it is possible to suppress dielectric breakdown in the silicon oxide film 6. Thus, it is possible to suppress the inconvenience of the semiconductor device 20 having lower withstand voltage characteristics resulting from dielectric breakdown in the silicon oxide film 6.

In the first embodiment, the width of the metal layer 7 in the direction of arrangement of the trenches 3 (direction A) is made smaller than the width of the buried electrode (gate electrode) 5 in direction A. With this configuration, it is possible to reduce the area of the metal layer 7 as seen in a plan view. Thus, it is possible to reduce the capacitance between the buried electrode (gate electrode) 5 and the metal layer 7. As a result, it is possible to reduce the total capacitance (gate input capacitance) of the buried electrodes (gate electrodes) easily.

In the first embodiment, the metal layer 7 is formed of W (tungsten). With this configuration, the metal layer 7 can be formed inside the trench 3 easily. Thus, it is possible to form, inside the trench 3, a capacitor connected in series with the buried electrode (gate electrode) 5 easily.

FIGS. 4 to 13 are sectional views in illustration of a fabrication method of the semiconductor device according to the first embodiment of the invention shown in FIG. 1. Next, with reference to FIGS. 1 and 4 to 13, the fabrication method of the semiconductor device 20 according to the first embodiment of the invention will be described.

Figure 4:
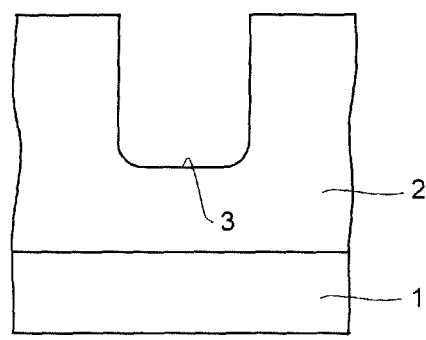
FIG. 4 A sectional view in illustration of the fabrication method of the semiconductor device according to the first embodiment of the invention.

First, on the top face of an n+ type silicon substrate 1 doped with an n type dopant at a high concentration, by epitaxial growth or the like, an n type epitaxial layer 2 is grown to have a thickness (a) (see FIG. 1) of about 1 μm to about 10 μm from an n type silicon doped with an n type dopant at a lower concentration (e.g., about $5 \times 10^{15}$ cm$^{-3}$ to about $1.0 \times 10^{18}$ cm$^{-3}$) than the n+ type silicon substrate 1. Next, as shown in FIG. 4, by photolithography and etching, in predetermined regions of the n type epitaxial layer 2, a plurality of trenches 3 are formed. At this time, the plurality of trenches 3 are formed each in an elongate shape so as to extend in a predetermined direction parallel to the top face of the n type epitaxial layer 2. As shown in FIG. 1, the plurality of trenches 3 are arrange at an interval (b) of about 0.05 μm to about 0.3 μm from one another in a direction (direction A) parallel to the top face of the n type epitaxial layer 2 and perpendicular to the direction in which the trenches 3 extend. The plurality of trenches 3 are each given a depth (c) of about 0.5 μm to about 5 μm so that their depth is smaller than the depth (a) of the n type epitaxial layer 2. The plurality of trenches 3 are each given a width (d) of about 0.1 μm to about 1 μm in direction A.

Next, defects that have developed in the n type epitaxial layer 2 as a result of etching are removed. Specifically, sacrificial oxidation is performed, and a surface oxide layer (SiO$_2$ layer, unillustrated) formed through sacrificial oxidation is removed by etching.

Figure 5:
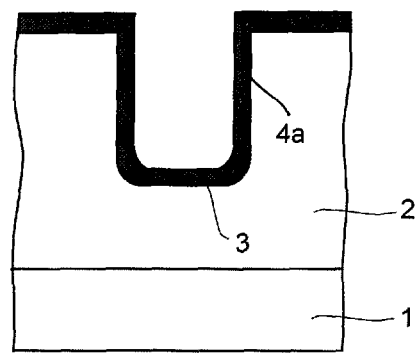
FIG. 5 A sectional view in illustration of the fabrication method of the semiconductor device according to the first embodiment of the invention.

Subsequently, the n+ type silicon substrate 1 is subjected to thermal oxidation, and thereby, as shown in FIG. 5, a surface oxide (SiO$_2$) layer 4a is grown. As a result, a silicon oxide film 4 (4a) of SiO$_2$ is formed so as to cover the interior wall (bottom and side surface) of the trench 3. At this time, the silicon oxide film 4 (4a) is grown to have a thickness of about 10 nm to about 100 nm.

Figure 6:
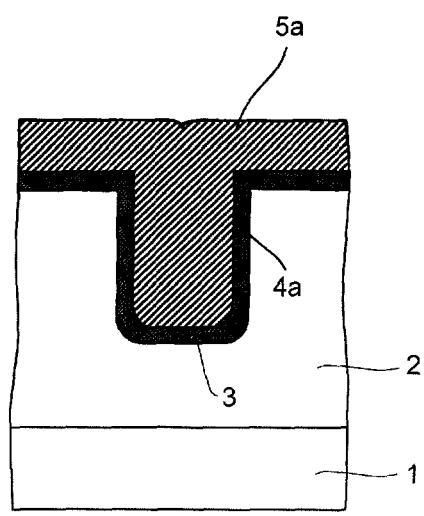
FIG. 6 A sectional view in illustration of the fabrication method of the semiconductor device according to the first embodiment of the invention.
Figure 7:
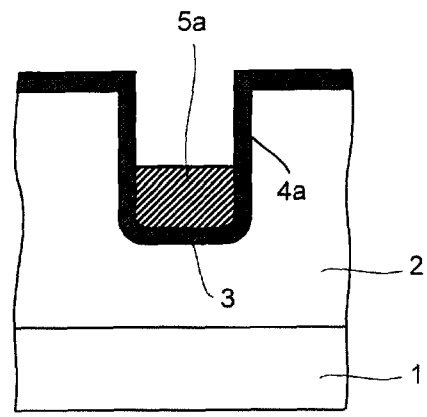
FIG. 7 A sectional view in illustration of the fabrication method of the semiconductor device according to the first embodiment of the invention.

Next, as shown in FIG. 6, by CVD or the like, a polysilicon layer 5a made conductive by being doped with a dopant is formed over the entire surface. Then, as shown in FIG. 7, by etch-back, a predetermined region of the polysilicon layer 5a is removed. As a result, inside each trench 3, the top face (etched-back surface) of the polysilicon layer 5a is formed below the top face of the n type epitaxial layer 2, and thus, inside the trench 3, a buried electrode (gate electrode) 5 of polysilicon is formed.

Figure 8:
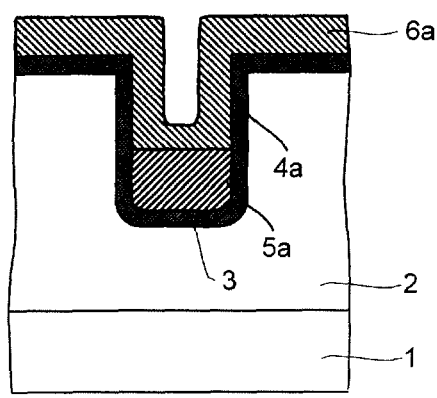
FIG. 8 A sectional view in illustration of the fabrication method of the semiconductor device according to the first embodiment of the invention.
Figure 9:
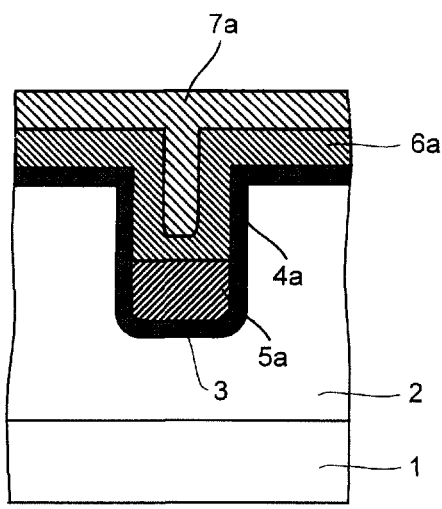
FIG. 9 A sectional view in illustration of the fabrication method of the semiconductor device according to the first embodiment of the invention.

Thereafter, as shown in FIG. 8, a SiO$_2$ layer 6a is formed over the entire surface. Then, as shown in FIG. 9, by vapor deposition or the like, a metal layer 7a of W (tungsten) is formed over the entire surface.

Figure 10:
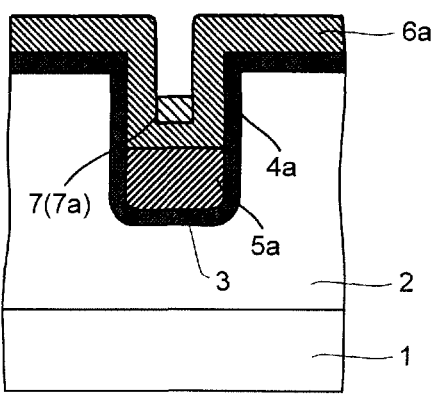
FIG. 10 A sectional view in illustration of the fabrication method of the semiconductor device according to the first embodiment of the invention.
Figure 11:
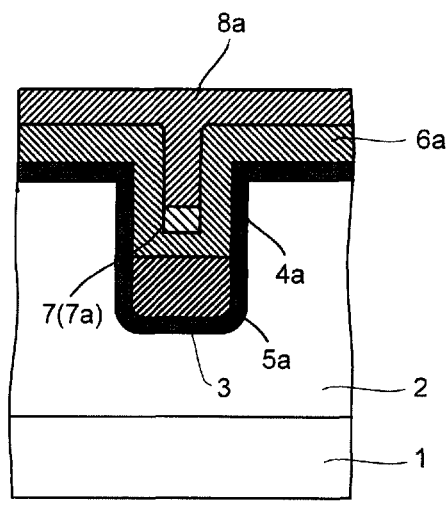
FIG. 11 A sectional view in illustration of the fabrication method of the semiconductor device according to the first embodiment of the invention.
Figure 12:
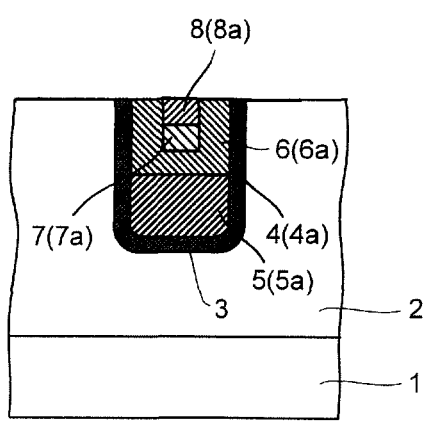
FIG. 12 A sectional view in illustration of the fabrication method of the semiconductor device according to the first embodiment of the invention.

Subsequently, as shown in FIG. 10, by metal etch-back, a predetermined region of the metal layer 7a is removed, and thereby a metal layer 7 is formed inside the trench 3. Next, as shown in FIG. 11, a SiO$_2$ layer 8a is formed over the entire surface. Then, by etch-back, the SiO$_2$ layer 8a, the SiO$_2$ layer 6a, and the surface oxide layer 4a are removed until the top face of the n type epitaxial layer 2 is exposed. As a result, as shown in FIG. 12, on the top face of the buried electrode (gate electrode) 5, an interlayer insulation film 8 is formed whose top face is substantially flush with the top face of the n type epitaxial layer 2, and the top face of the n type epitaxial layer 2 is flattened. The metal layer 7 is thus formed above the buried electrode (gate electrode) 5 with a silicon oxide film 6 interposed in between.

Figure 13:
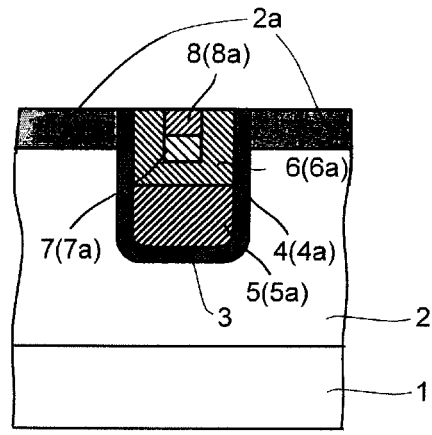
FIG. 13 A sectional view in illustration of the fabrication method of the semiconductor device according to the first embodiment of the invention.
Figure 14:
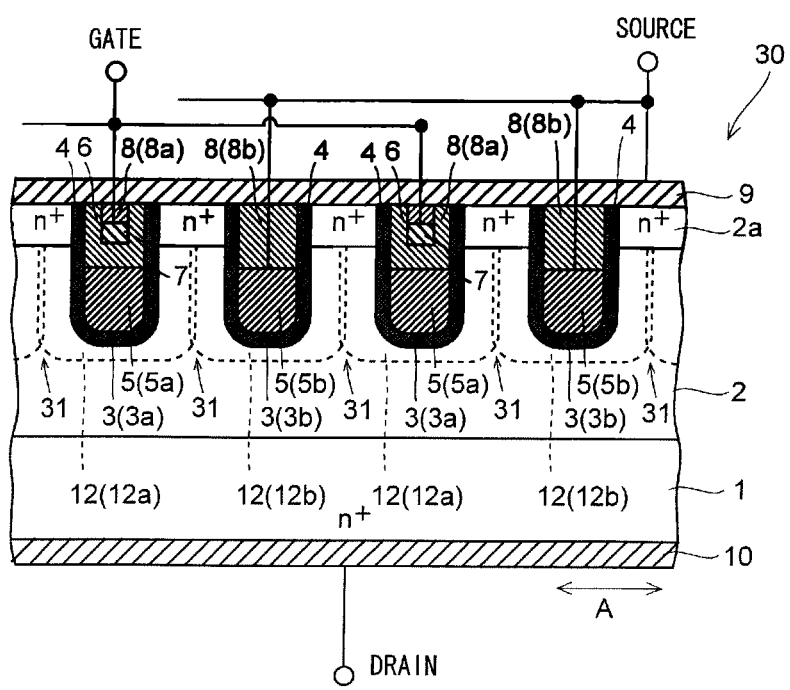
FIG. 14 A sectional view showing the structure of a semiconductor device according to a second embodiment of the invention.

Next, as shown in FIG. 13, a high-concentration region 2a ion-injected with an n type dopant at a high concentration is formed so that no low-concentration region is exposed at the top face of the n type epitaxial layer 2. Then, as shown in FIG. 1, a source electrode 9 of Al is formed so as to cover the open sides of the plurality of trenches 3. Lastly, on the back (bottom) face of the n+ type silicon substrate 1, a multiple-layer structure having a plurality of metal layers laid together is formed as a drain electrode 10. In this way, the semiconductor device 20 according the first embodiment of the invention is formed Second Embodiment FIG. 14 is a sectional view showing the structure of a semiconductor device according to a second embodiment of the invention. Next, with reference to FIG. 14, the structure of the semiconductor device 30 according to the second embodiment of the invention will be described.

In the semiconductor device 30 according to the second embodiment, on the interior surface of each of a plurality of trenches 3, a buried electrode 5 of p type polysilicon is formed with a silicon oxide film 4 interposed in between. A plurality of such buried electrodes 5 are grouped into two types, a first and a second type, of buried electrodes 5a and 5b to which separate voltages are applied. The buried electrodes 5a of the first type are so configured that a voltage corresponding to a predetermined control signal (a signal for effecting switching between on and off) is applied to them. The buried electrodes 5b of the second type are electrically connected to a source electrode 9. That is, the buried electrodes 5b of the second type are so configured as to have an equal potential to the source electrode 9. The buried electrodes 5a and 5b are arranged alternately, one of one type next to one of the other type, in direction A. Thus, between two buried electrodes 5a (or 5b) lies one buried electrode 5b (or 5a). It is to be understood that the buried electrodes 5a and 5b are an example of a "first buried electrode" and a "second buried electrode," respectively, according to the invention.

In a trench 3 in which a buried electrode 5a is buried (hereinafter referred to as a trench 3a), above the buried electrode 5a, a metal layer 7 of W (tungsten) is formed with a silicon oxide film 6 interposed in between. The metal layer 7 is capacitively coupled to the buried electrode 5a. In the trench 3a, in a part above the metal layer 7, a silicon oxide film is formed as an interlayer insulation film 8 (8a). On the other hand, in a trench 3 in which a buried electrode 5b is buried (hereinafter referred to as a trench 3b), in a part above the buried electrode 5b, with no metal layer 7 formed, an interlayer insulation film 8 (8b) of SiO$_2$ is formed. In other respects, the semiconductor device 30 according to the second embodiment is structured similarly to the semiconductor device 20 according to the first embodiment described previously.

Figure 15:
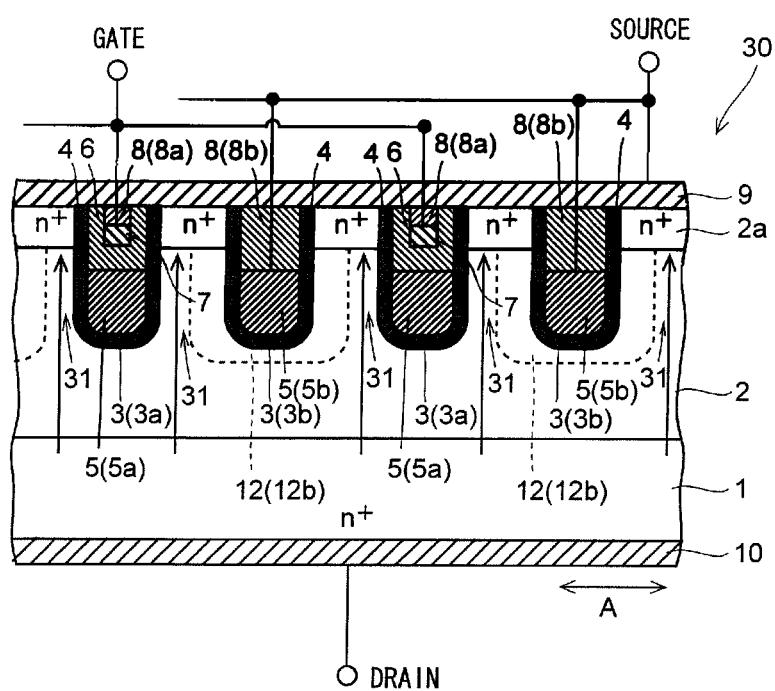
FIG. 15 A sectional view in illustration of the operation of the semiconductor device according to the second embodiment of the invention.

FIG. 15 is a sectional view in illustration of the operation of the semiconductor device according to the second embodiment of the invention. Next, with reference to FIGS. 14 and 15, the operation of the semiconductor device 30 according to the second embodiment of the invention will be described. In the following description of operation, it is assumed that a negative and a positive potential are applied to the source electrode 9 and the drain electrode 10 respectively.

In an off state, as shown in FIG. 14, the buried electrodes 5b are electrically connected to the source electrode 9, and thus a negative potential is applied to the buried electrodes 5b. Accordingly, around the trenches 3 (3b) having the buried electrodes 5b buried in them, a reduced number of majority carriers are present. That is, around the trenches 3b respectively, depletion layers 12 (12b) are formed irrespective of in an on or off state. Moreover, in an off state, the voltage applied to the buried electrodes 5a is so controlled as to reduce the number of majority carriers present around the trenches 3 (3a) having the buried electrodes 5a buried in them. Accordingly, also around the trenches 3a, depletion layers 12 (12a) are formed which are similar to the depletion layers 12 (12b) formed around the trenches 3b.

At this time, in the regions between the trenches 3a and 3b, the depletion layers 12a and 12b formed around the trenches 3a and 3b partly overlap with one another. That is, in the regions between the trenches 3a and 3b, the depletion layers 12a and 12b are joined together. Consequently, channels (current passages) 31 are stopped with the depletion layers 12a and 12b, and in this way the current passing through the channels (current passages) 31 can be cut-off. Accordingly, the semiconductor device 30 goes into an off state.

To switch from an off state to an on state, as shown in FIG. 15, a predetermined positive potential is applied to the buried electrodes 5a to make the depletion layers 12a (see FIG. 14) formed around the trenches 3a disappear. This enables a current to pass in the direction indicated by arrows in FIG. 15 through the buried electrode 5a (trench 3a)-side parts of the channels (current passages) 31, and in this way the semiconductor device 30 can be brought into an on state.

On the other hand, to switch the semiconductor device 30 from an on state to an off state, the predetermined positive potential stops being applied to the buried electrodes 5a. This restores the state shown in FIG. 14, and in this way the semiconductor device 30 can be brought into an off state.

The benefits of the second embodiment are similar to those of the first embodiment described previously.

Third Embodiment

Figure 16:
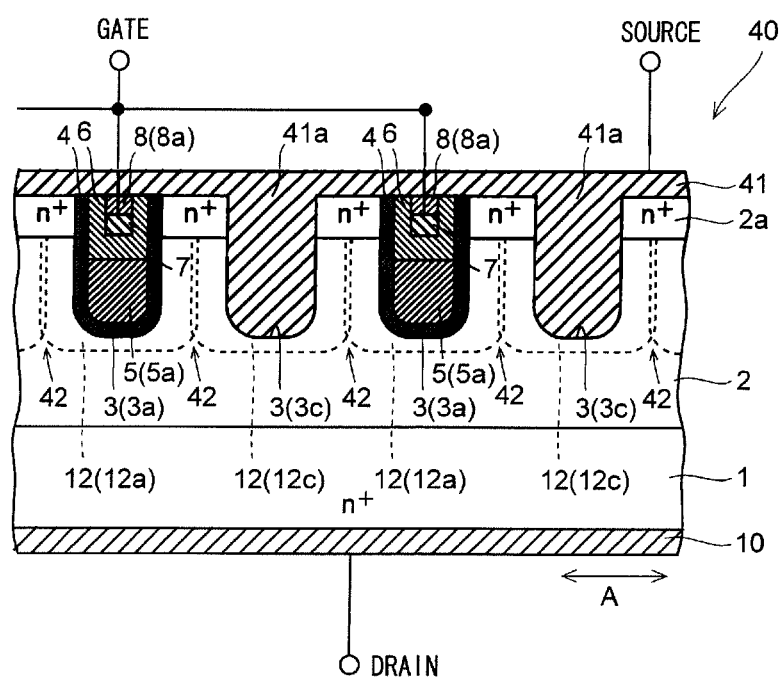
FIG. 16 A sectional view showing the structure of a semiconductor device according to a third embodiment of the invention.

FIG. 16 is a sectional view showing the structure of a semiconductor device according to a third embodiment of the invention. Next, with reference to FIG. 16, the structure of the semiconductor device 40 according to the third embodiment of the invention will be described.

In the semiconductor device 40 according the third embodiment, there are provided, on one hand, trenches 3 (3a) in which buried electrodes 5 (5a) are buried to which a predetermined control signal is applied and, on the other hand, trenches 3 (3c) in which parts of a source electrode 41 (hereinafter referred to as the buried portions 41a) are buried. The trenches 3a and 3c are arranged alternately, one of one type next to one of the other type, at a predetermined interval from each other. Inside the trenches 3c, the buried portions 41a of the source electrode 41 make Schottky contact with an epitaxial layer 2. It is to be understood that the buried portions 41a of the source electrode 41 are an example of a "second buried electrode" according to the invention.

In the third embodiment, when a voltage is applied between the source electrode 41 and a drain electrode 10, the current that passes between the source electrode 41 and the drain electrode 10 passes through the regions between the trenches 3a and 3c. That is, in the third embodiment, the regions between the trenches 3a and 3c function as channels (current passages) 42 respectively.

As in the second embodiment described previously, inside the trenches 3a, above the buried electrodes 5a, metal layers 7 of W (tungsten) are formed.

In other respects, the semiconductor device 40 according to the third embodiment is structured similarly to the semiconductor device 20 according to the first embodiment described previously.

Figure 17:
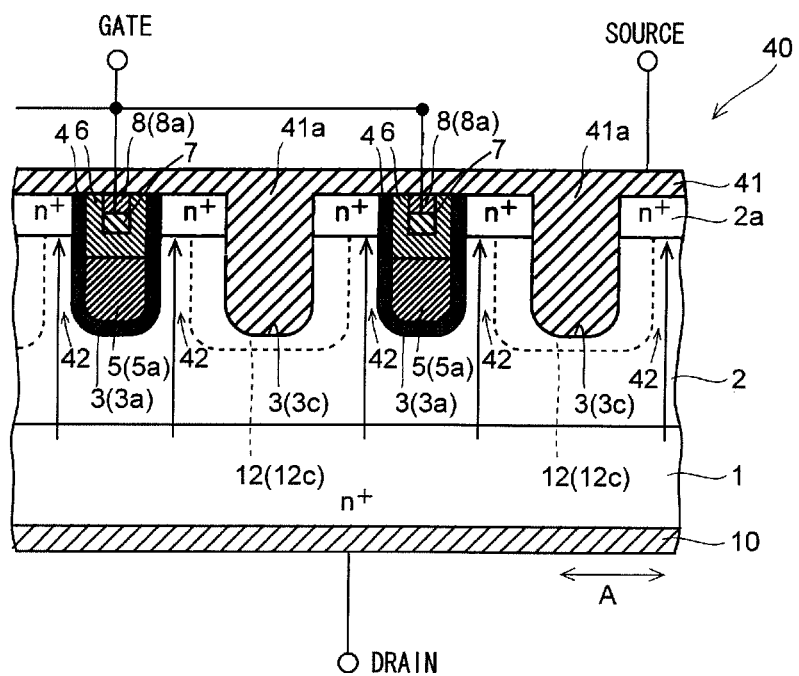
FIG. 17 A sectional view in illustration of the operation of the semiconductor device according to the third embodiment of the invention.

FIG. 17 is a sectional view in illustration of the operation of the semiconductor device according to the third embodiment of the invention. Next, with reference to FIGS. 16 and 17, the operation of the semiconductor device 40 according to the third embodiment of the invention will be described.

In the following description of operation, it is assumed that a negative and a positive potential are applied to the source electrode 41 and the drain electrode 10 respectively. Thus, around the trenches 3c having the buried portions 41a of the source electrode 41 buried in them, depletion layers 12 (12c) are formed irrespective of in an on or off state.

In an off state, as shown in FIG. 16, a negative potential is applied to the buried electrodes 5a so that depletion layers 12 (12a) are formed around the trenches 3a. As a result, the channels (current passages) 42 are stopped by the depletion layers 12a and 12c, and in this way the current passing through the channels (current passages) 42 can be cut off.

To switch from an off state to an on state, as shown in FIG. 17, a positive potential is applied to the buried electrodes 5a to make the depletion layers 12a shown in FIG. 16 disappear. This enables a current to pass in the direction indicated by arrows in FIG. 16 through the buried electrode 5a (trench 3a)-side parts of the channels (current passages) 42.

On the other hand, to switch the semiconductor device 40 from an on state to an off state, the predetermined positive potential stops being applied to the buried electrodes 5a. This restores the state shown in FIG. 16, and in this way the semiconductor device 40 can be brought into an off state.

The benefits of the third embodiment are similar to those of the first embodiment described previously.

Fourth Embodiment

Figure 18:
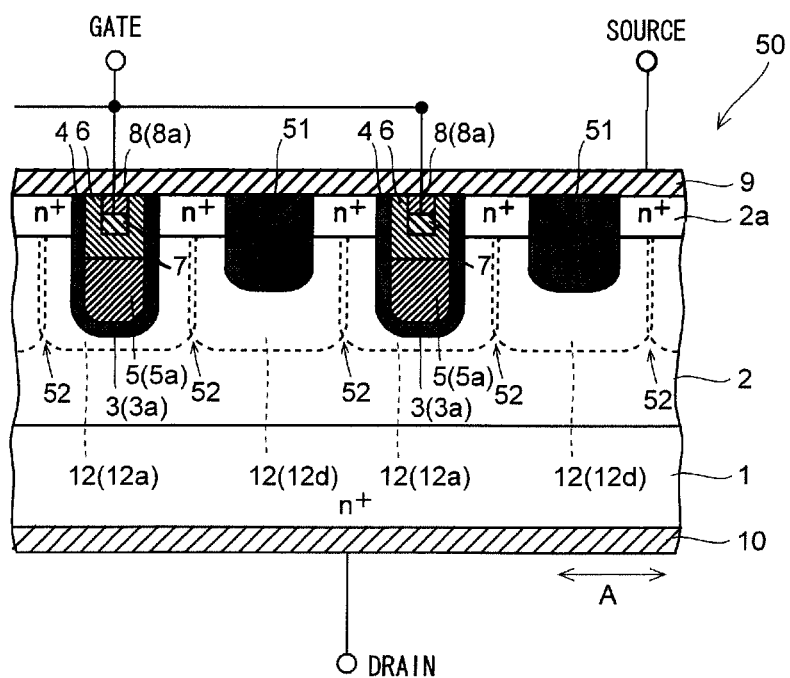
FIG. 18 A sectional view showing the structure of a semiconductor device according to a fourth embodiment of the invention.

FIG. 18 is a sectional view showing the structure of a semiconductor device according to a fourth embodiment of the invention. Next, with reference to FIG. 18, the structure of the semiconductor device 50 according to the fourth embodiment of the invention will be described.

In the semiconductor device 50 according to the fourth embodiment, there are provided, in addition to trenches 3 (3a) in which buried electrodes 5 (5a) are buried to which a predetermined control signal is applied, $p^+$ type diffusion regions 51 doped with a p type dopant at a high concentration. The $p^+$ type diffusion regions 51 are arranged in the regions between mutually adjacent trenches 3 (3a), at a predetermined interval from the trenches 3 (3a), one $p^+$ type diffusion region 51 next to one trench 3 (3a). The $p^+$ type diffusion regions 51 make ohmic contact with the source electrode 9. It is to be understood that the $p^+$ type diffusion regions 51 are an example of a "diffusion region of an opposite conductivity type" according to the invention.

In the fourth embodiment, when a voltage is applied between the source electrode 9 and a drain electrode 10, the current that passes between the source electrode 9 and the drain electrode 10 passes through the regions between the trenches 3 (3a) and the $p^+$ type diffusion regions 51. That is, in the fourth embodiment, the regions between the trenches 3 (3a) and the $p^+$ type diffusion regions 51 function as channels (current passages) 52 respectively.

As in the second and third embodiments described previously, inside the trenches 3 (3a), above the buried electrodes 5a, metal layers 7 of W (tungsten) are formed.

In other respects, the semiconductor device 50 according to the fourth embodiment is structured similarly to the semiconductor device 20 according to the first embodiment described previously.

Figure 19:
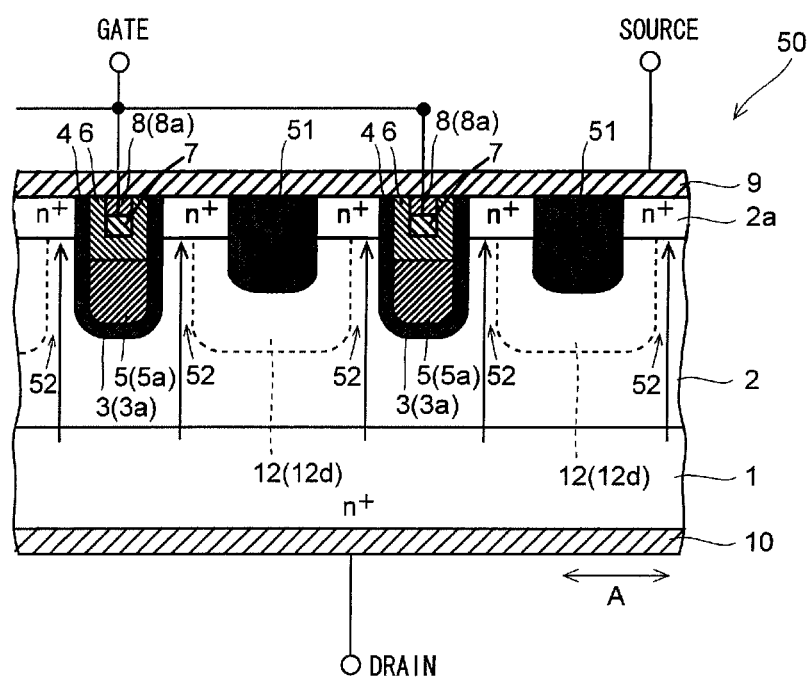
FIG. 19 A sectional view in illustration of the operation of the semiconductor device according to the fourth embodiment of the invention.

FIG. 19 is a sectional view in illustration of the operation of the semiconductor device according to the fourth embodiment of the invention. Next, with reference to FIGS. 18 and 19, the operation of the semiconductor device 50 according to the fourth embodiment of the invention will be described.

In the following description of operation, it is assumed that a negative and a positive potential are applied to the source electrode 9 and the drain electrode 10 respectively. Thus, around the $p^+$ type diffusion regions 51, depletion layers 12 (12d) are formed irrespective of in an on or off state.

In an off state, as shown in FIG. 18, a negative potential is applied to the buried electrodes 5a so that depletion layers 12 (12a) are formed around the trenches 3a. As a result, the channels (current passages) 52 are stopped by the depletion layers 12a and 12d, and in this way the current passing through the channels (current passages) 52 can be cut off.

To switch from an off state to an on state, as shown in FIG. 19, a positive potential is applied to the buried electrodes 5a to make the depletion layers 12a shown in FIG. 18 disappear. This enables a current to pass in the direction indicated by arrows in FIG. 19 through the buried electrode 5a (trench 3a)-side parts of the channels (current passages) 52.

On the other hand, to switch the semiconductor device 50 from an on state to an off state, the predetermined positive potential stops being applied to the buried electrodes 5a. This restores the state shown in FIG. 18, and in this way the semiconductor device 50 can be brought into an off state.

The benefits of the fourth embodiment are similar to those of the first embodiment described previously.

Fifth Embodiment

Figure 20:
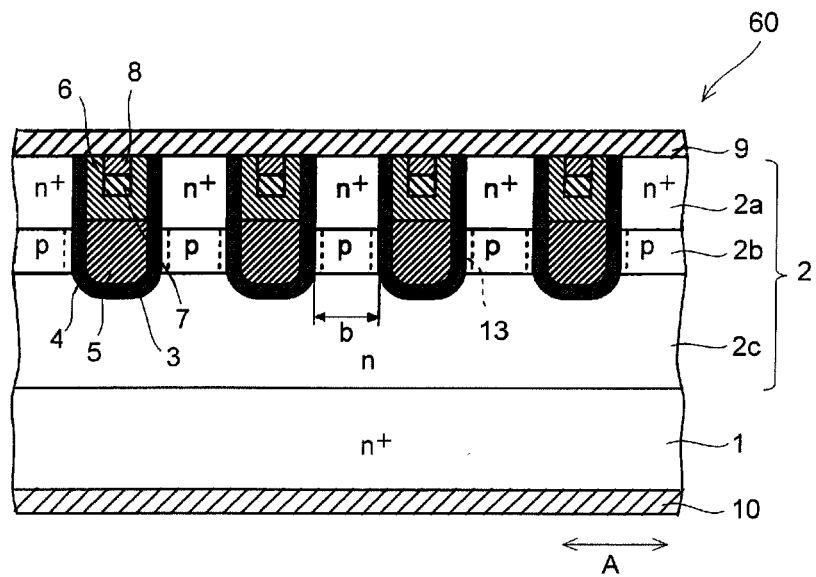
FIG. 20 A sectional view showing the structure of a semiconductor device according to a fifth embodiment of the invention.

FIG. 20 is a sectional view showing the structure of a semiconductor device according to a fifth embodiment of the invention. Next, referring to FIG. 20, the semiconductor device 60 according to the fifth embodiment is configured as a trench-gate type MOSFET having buried electrodes (gate electrodes) 5 buried inside trenches 3. That is, in the semiconductor device 60 according to the fifth embodiment, in each of the regions between mutually adjacent trenches 3, between the high-concentration region (source region) 2a and a low-concentration region (drain region) 2c of the n type epitaxial layer 2, a p type doped region 2b is formed.

In the fifth embodiment, when a predetermined positive potential is applied to metal layers 7, since the metal layers 7 are capacitively coupled to the buried electrodes (gate electrodes) 5, a predetermined positive potential is applied to the buried electrodes (gate electrodes) 5. Thus, the majority carriers (electrons) in the p type doped regions 2b are attracted toward the trenches 3, and as a result, around the trenches 3 in the p type doped regions 2b, inversion layers 13 are formed so as to connect the low-concentration region (drain region) 2c and the high-concentration region (source region) 2a together. This enables a current to pass through the inversion layers 13 between the source electrode 9 and the drain electrode 10, and consequently the semiconductor device 60 goes into an on state. On the other hand, when the predetermined positive potential stops being applied to the metal layers 7, the predetermined positive potential stops being applied to the buried electrodes (gate electrodes) 5, and thus the inversion layers 13 disappear. This permits the current between the source electrode 9 and the drain electrode 10 to be cut off, and consequently the semiconductor device 60 goes into an off state.

In other respects, the semiconductor device 60 according to the fifth embodiment is configured similarly to the semiconductor device 20 according to the first embodiment described previously.

In the fifth embodiment, as described above, the metal layers 7 capacitively coupled to the buried electrodes (gate electrodes) 5 are formed inside the plurality of trenches 3 respectively; in this way, capacitors connected in series with the buried electrodes (gate electrodes) 5 can be formed inside the plurality of trenches 3 respectively. Thus, it is possible to reduce the total capacitance (gate input capacitance) of the buried electrodes (gate electrodes) 5 inside the plurality of trenches 3 respectively. As a result, by controlling the voltage applied to the buried electrodes (gate electrodes) 5, it is possible to quicken the on/off switching speed at the time of switching from an off state to an on state and switching in the opposite direction. That is, it is possible to quicken the switching speed.

In the fifth embodiment, the interlayer insulation films 8 are formed on the top face of the metal layers 7, and are formed inside the trenches 3 respectively so that the top face of the interlayer insulation films 8 is flush with the top face of the n type epitaxial layer 2; in this way, between the interlayer insulation films 8 formed in mutually adjacent trenches 3, the interlayer insulation film 8 formed in one trench 3 can be prevented from making contact with the interlayer insulation film 8 formed in the next trench 3. Thus, it is possible to shorten the interval (b) between mutually adjacent trenches 3 easily; accordingly, by shortening the interval (b) between mutually adjacent trenches 3, it is possible to increase the trench density per unit area. As a result, it is possible to increase the total area of the inversion layers 13, and thus it is possible, while quickening the switching speed, to reduce the on-state resistance.

Figure 21:
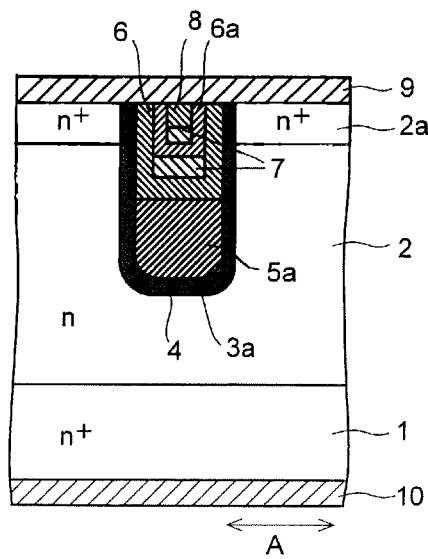
FIG. 21 A sectional view showing part of the structure of a semiconductor device according to a modified example of the invention.

Although the first to fifth embodiments describe above deal with examples in which a single metal layer is formed inside a trench, this is not meant to limit the invention; instead, as shown in FIG. 21, inside a trench 3, two metal layers 2 may be provided that are formed with a silicon oxide film interposed in between. It is possible even to provide more than two metal layers 7.

Sixth Embodiment

Figure 22:
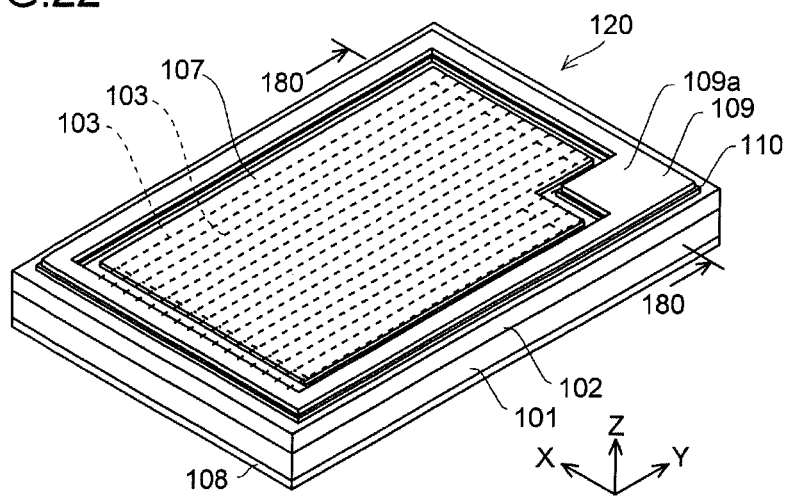
FIG. 22 A sectional view showing the structure of a semiconductor device according to a sixth embodiment of the invention.
Figure 23:
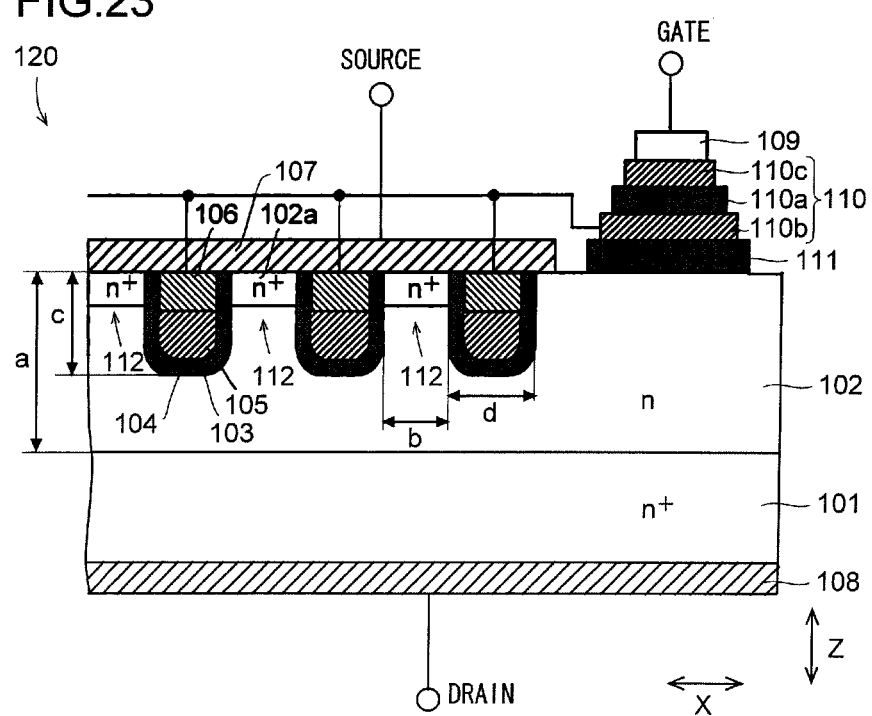
FIG. 23 A sectional view along the line 180-180 in FIG. 22.
Figure 24:
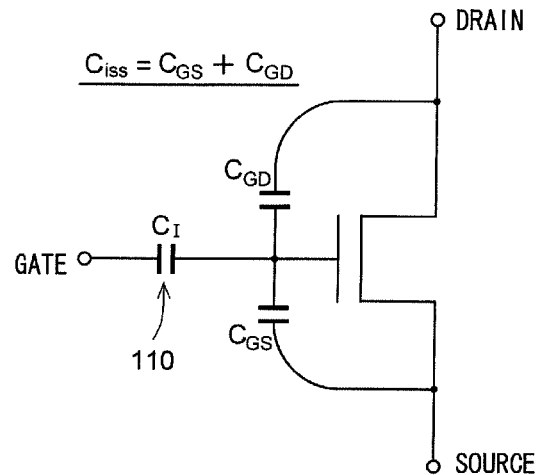
FIG. 24 An equivalent circuit diagram of the semiconductor device according to the sixth embodiment of the invention.

FIG. 22 is an overall perspective view showing a semiconductor device according to a sixth embodiment of the invention, and FIG. 23 is a sectional view along the line 180-180 in FIG. 22. FIG. 24 is an equivalent circuit diagram of the semiconductor device according to the sixth embodiment of the invention shown in FIG. 22. First, with reference to FIGS. 22 to 24, the structure of the semiconductor device 120 according to the sixth embodiment will be described. The semiconductor device 120 according to the sixth embodiment is configured to function as a normally-off type switching device. In FIG. 24, for convenience' sake, an equivalent circuit diagram of the semiconductor device according to the sixth embodiment is shown by use of circuit symbols commonly used in MOSFETs.

In the semiconductor device 120 of the sixth embodiment, as shown in FIGS. 22 and 23, on the top face of an n$^+$ type silicon substrate 101, an n type epitaxial layer 102 of n type silicon with a thickness (a) of about 1 μm to about 10 nm is formed. The n$^+$ type silicon substrate 101 is doped with an n type dopant at a high concentration, to form a good ohmic contact with a drain electrode 108, which will be described later. The n type epitaxial layer 102 is doped with an n type dopant at a lower concentration (e.g., about $5 \times 10^{18}$ cm$^{-3}$ to about $1.0 \times 10^{18}$ cm$^{-3}$) than the n$^+$ type silicon substrate 101. It is to be understood that the n$^+$ type silicon substrate 101 and the n type epitaxial layer 102 are an example of a "semiconductor layer of one conductivity type" according to the invention.

As shown in FIG. 23, the n type epitaxial layer 102 has a plurality of trenches 103 dug in its thickness direction (direction Z). The plurality of trenches 103 are formed as a result of predetermined regions of the n type epitaxial layer 102 being etched from above its top face (main surface). Thus, the plurality of trenches 103 have their respective open sides located at the top face of the n type epitaxial layer 102.

As shown in FIG. 22, the plurality of trenches 103 are formed each in an elongate shape so as to extend in a predetermined direction (direction Y) parallel to the top face of the n type epitaxial layer 102. The plurality of trenches 103 are arranged at an interval (b) of about 0.05 μm to about 0.3 μm from one another in a direction (direction X) parallel to the top face of the n type epitaxial layer 102 and perpendicular to the direction (direction Y) in which the trenches 103 extend. As shown in FIG. 23, the plurality of trenches 103 are each given a depth (c) of about 0.5 μm to about 5 μm so that their depth is smaller than the depth (a) of the n type epitaxial layer 102. The plurality of trenches 103 are each given a width (d) of about 0.1 μm to about 1 μm in direction X.

On the interior surface of each of the plurality of trenches 103, by applying thermal oxidation to the n type silicon forming the n type epitaxial layer 102, a silicon oxide film 104 with a thickness of about 10 nm to about 100 nm is formed. It is to be understood that the silicon oxide film 104 is an example of a "fifth insulation film" according to the invention.

On the interior surface of each of the plurality of trenches 103, with the silicon oxide film 104 interposed, a buried electrode (gate electrode) 105 of p type polysilicon is formed. A plurality of such buried electrodes (gate electrodes) 105 are electrically connected together so that an equal voltage is applied to them. Each of the plurality of buried electrodes (gate electrodes) 105 is buried to fill the corresponding trench 103 halfway up to a depth somewhere within its depth.

In the sixth embodiment, a plurality of buried electrodes (gate electrodes) 105 as described above are provided; thus, by controlling the voltage applied to the plurality of buried electrodes (gate electrodes) 105, it is possible to form depletion layers around a plurality of trenches 103 respectively and to make the so formed depletion layers disappear. In the sixth embodiment, the interval (b) between mutually adjacent trenches 103 is so set that, when depletion layers are formed around the plurality of trenches 103 respectively, the depletion layers formed around mutually adjacent trenches 103 partly overlap with each other. That is, when depletion layers are formed around the trenches 103 respectively, the depletion layers formed around mutually adjacent trenches 103 are joined together. Thus, in the sixth embodiment, by forming depletion layers around the plurality of trenches 103 respectively, it is possible to stop the regions between mutually adjacent trenches 103 with depletion layers respectively.

In the remaining part of each of the plurality of trenches 103 other than the part where the buried electrode 105 is buried (the part above the buried electrode 105), a silicon oxide film is buried as an interlayer insulation film 106. A plurality of such interlayer insulation films 106 are provided to insulate between the corresponding buried electrodes (gate electrodes) 105 and a source electrode 107, which will be described later. Each of the plurality of interlayer insulation films 106 is given a thickness equal to the depth of the remaining part of the corresponding trench 103 other than the part where the buried electrode 105 is buried (the part above the buried electrode 105). Thus, the top face of each of the plurality of interlayer insulation films 106 is flush with the top face of the n type epitaxial layer 102 (the top face of a top-end part of the regions between mutually adjacent trenches 103).

In a top-face part of the n type epitaxial layer 102 (a top-end part of the regions between mutually adjacent trenches 103), a high-concentration region 102a is formed which is ion-injected with an n type dopant at a high concentration so that no low-concentration region is exposed at the top face of the n type epitaxial layer 102. The dopant concentration in the high-concentration region 102a of the n type epitaxial layer 102 is so set as to form a good ohmic contact with a source electrode 107, which will be described later, and is higher than the dopant concentration in the other part of the n type epitaxial layer 102. The high-concentration region 102a of the n type epitaxial layer 102 is given a thickness (depth after diffusion by ion injection) smaller than the thickness of the silicon oxide film 106. Thus, the bottom-end part of the high-concentration region 102a of the n type epitaxial layer 102 is located above the top-end part of the buried electrodes (gate electrodes) 105.

On the top face of the n type epitaxial layer 102, an Al layer is formed as a source electrode 107 so as to cover the open sides of the plurality of trenches 3 respectively. The source electrode 109 makes ohmic contact with the high-concentration region 102a of the n type epitaxial layer 102 (a top-end part of the regions between mutually adjacent trenches 103).

On the back (bottom) face of the n⁺ type silicon substrate 101, a multiple-layer structure having a plurality of metal layers laid together is formed as a drain electrode 108. The drain electrode 108 makes ohmic contact with the n⁺ type silicon substrate 101.

On the top face of the n type epitaxial layer 102, a pad electrode layer 109 is formed which is electrically connected to the buried electrodes (gate electrodes) 105. Specifically, the pad electrode layer 109 is formed on a region in a peripheral part on the top face of the n type epitaxial layer 102, so as to surround the source electrode 107. The pad electrode layer 109 has a bonding portion 109a with a comparatively large area, to which a bonding wire (unillustrated) is bonded.

Here, in the sixth embodiment, between the n type epitaxial layer 102 and the pad electrode layer 109, a capacitor 110 with a capacitance of C, is formed. The capacitor 110 is composed of a dielectric layer 110a laid between a lower electrode layer 110b and an upper electrode layer 110c. It is to be understood that the dielectric layer 110a is an example of a "fourth insulation film" according to the invention, and that the lower and upper electrode layers 110b and 110c are an example of a "first electrode" and a "second electrode," respectively, according to the invention. The lower electrode layer 110b of the capacitor 110 and the n type epitaxial layer 102 are insulated and separated from each other by an insulation/separation film 111. Thus, the capacitor 110 is formed on the top face of, while being insulated and separated from, the n type epitaxial layer 102. Specifically, in a region in a peripheral part on the top face of the n type epitaxial layer 102, the insulation/separation film 111 of $SiO_2$ is formed so as to surround the source electrode 107; on the insulation/separation film 111 are successively formed the lower electrode layer 110b, the dielectric layer 110a, and the upper electrode layer 110c in this order from the insulation/separation film 111 side. On the top face of the upper electrode layer 110c, the pad electrode layer 109 is formed. The dielectric layer 110a is formed of $SiO_2$, and the lower and upper electrode layers 110b and 110c are each formed of polysilicon made conductive.

In the sixth embodiment, the dielectric layer 110a included in the capacitor 110 is given a thickness equal to or larger than the thickness (about 10 nm to about 100 nm) of the silicon oxide film 104. Specifically, the dielectric layer 110a is given a thickness of about 50 nm to about 1000 nm. Moreover, the capacitor 110 is so configured that the capacitance C, can be varied in a wide range, from a low to a high capacitance, by changing the planar area of the upper electrode layer 110c and the thickness of the dielectric layer 110a in many ways.

As shown in FIG. 22, the buried electrodes (gate electrodes) 105 formed inside the plurality of trenches 103 respectively are, at both ends of the trenches 103 in direction Y, electrically connected to the lower electrode layer 110b of the capacitor 110. As a result, as shown in FIG. 24, the buried electrodes (gate electrodes) 105 and the capacitor 110 are connected in series with each other. Moreover, the buried electrodes (gate electrodes) 105 and the pad electrode layer 109 are electrically connected together via the capacitor 110.

Thus, in the semiconductor device 120 according to the sixth embodiment, a voltage is applied to the buried electrodes (gate electrodes) 105 via the capacitor 110.

On the other hand, as a result of the buried electrodes (gate electrodes) 105 being covered by the silicon oxide films 104 and the interlayer insulation films 106, capacitors with capacitances $C_{GD}$ and $C_{GS}$ respectively are parasitically formed, the former between the buried electrodes (gate electrodes) 105 and the n type epitaxial layer 102 and the latter between the buried electrodes (gate electrodes) 105 and the source electrode 107. When the sum of the capacitances $C_{GD}$ and $C_{GS}$ is referred to as a capacitance $C_{iss}$, then the gate input capacitance (total capacitance $C_{Total}$) of the semiconductor device 120 according to the sixth embodiment is, since it is the sum of the capacitance $C_{iss}$ and the above-mentioned capacitance $C_I$ of the capacitor 110, given by formula (2) below.

(Formula 2)

$$C_{Total} = \frac{1}{\frac{1}{C_{iss}} + \frac{1}{C_I}} = \frac{C_{iss} \times C_I}{C_{iss} + C_I} (pF) \qquad (2)$$

For example, consider a case where the capacitance $C_{iss}$ of the capacitor parasitically formed at the buried electrodes (gate electrodes) 105 is 2000 pF and the capacitance $C_I$ of the capacitor 110 is 100 pF. Formula (1) above then gives about 95 pF as the total capacitance (gate input capacitance) $C_{Total}$ of the buried electrodes (gate electrodes) 105. Thus, in this case, the semiconductor device 120 according to the sixth embodiment has a reduced gate input capacitance, as low as about 1/20 (=95 pF/2000 pF) of the gate input capacitance of a semiconductor device having no capacitor 110 formed. It is to be noted that formula (2) above shows that the lower the capacitance $C_I$ of the capacitor 110, the lower the gate input capacitance (total capacitance $C_{Total}$) of the semiconductor device 120 according to the sixth embodiment.

Reducing the total capacitance (gate input capacitance) $C_{Total}$ of the buried electrodes (gate electrodes) 105 makes it possible to raise the threshold voltage, and therefore by controlling the capacitance $C_I$ of the capacitor 110, it is possible to adjust the threshold voltage.

In the configuration described above, when a voltage is applied between the source electrode 107 and the drain electrode 108, the current passing between the source electrode 107 and the drain electrode 108 (the current passing in the thickness direction (Z direction) of the n type epitaxial layer 102) passes through the regions between mutually adjacent trenches 103 in the n type epitaxial layer 102. That is, in the configuration described above, the regions between mutually adjacent trenches 103 in the n type epitaxial layer 102 function as channels 112 respectively.

Figure 25:
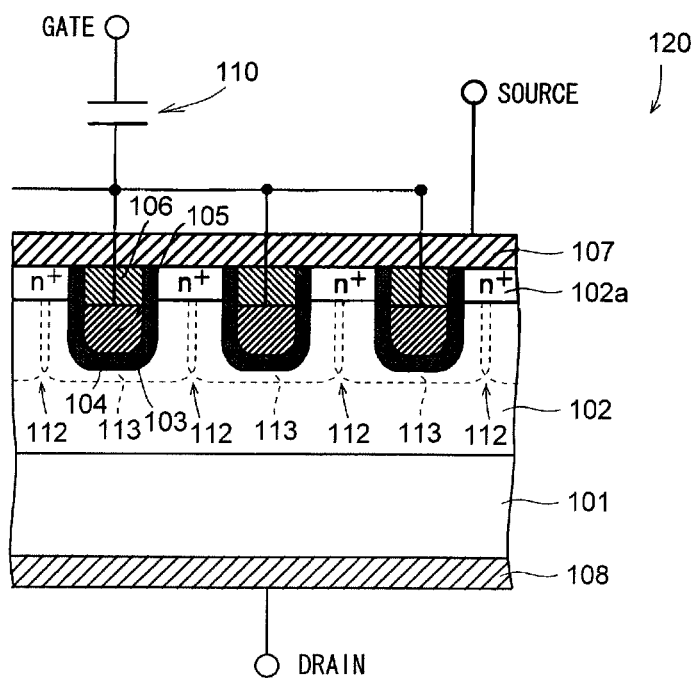
FIG. 25 A sectional view in illustration of the operation of the semiconductor device according to the sixth embodiment of the invention.
Figure 26:
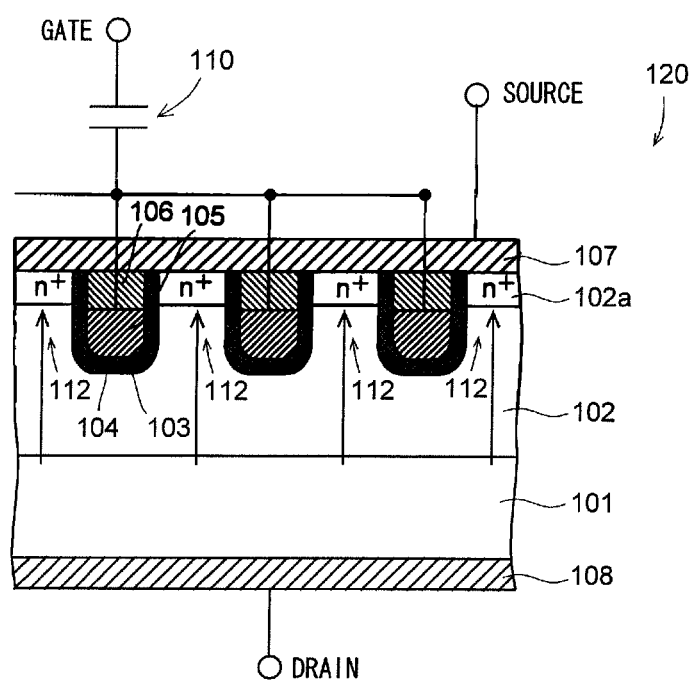
FIG. 26 A sectional view in illustration of the operation of the semiconductor device according to the sixth embodiment of the invention.

FIGS. 25 and 26 are diagrams in illustration of the operation of the semiconductor device according to the sixth embodiment of the invention. FIG. 25 shows the semiconductor device functioning as a switching device in an off state, and FIG. 26 shows the semiconductor device functioning as a switching device in an on state. Next, with reference to FIGS. 25 and 26, the operation of the semiconductor device 120 functioning as a switching device according to the sixth embodiment will be described.

In the following description, it is assumed that a negative potential is applied to the source electrode 107, and that a positive potential is applied to the drain electrode 108. Thus, when the semiconductor device 120 functioning as a switching device is in an on state, a current passes from the drain electrode 108 to the source electrode 107 (in the direction indicated by arrows in FIG. 26).

When the semiconductor device 120 functioning as a switching device is in an off state, as shown in FIG. 25, the voltage applied to the buried electrodes (gate electrodes) 105 is so controlled as to reduce the number of majority carriers present around the trenches 103 having the buried electrodes (gate electrodes) 105 buried in them. As a result, depletion layers 113 are formed around the trenches 103.

At this time, in the regions between mutually adjacent trenches 103, the depletion layers 113 formed around mutually adjacent trenches 103 partly overlap with each other. That is, in the regions between mutually adjacent trenches 103, the depletion layers 113 formed around mutually adjacent trenches 103 are joined together. Thus, the channels 112 are stopped by the depletion layers 113, and consequently the current passing through the channels 112 is cut off. Accordingly, the semiconductor device 120 functioning as a switching device goes into an off state.

To switch the semiconductor device 120 functioning as a switching device from an off state to an on state, as shown in FIG. 26, a predetermined positive potential (predetermined voltage) is applied to the buried electrodes (gate electrodes) 105 to make the depletion layers 113 (see FIG. 25) formed around the trenches 103 disappear. That is, the depletion layers 113 (see FIG. 25) that have been stopping the channels 112 are made to disappear. This enables a current to pass through the channels 112, and in this way the semiconductor device 120 functioning as a switching device can be brought into an on state.

On the other hand, to switch the semiconductor device 120 functioning as a switching device from an on state to an off state, the predetermined positive potential (predetermined voltage) stops being applied to the buried electrodes (gate electrodes) 105. This restores the state shown in FIG. 25, and in this way the semiconductor device 120 functioning as a switching device can be brought into an off state.

In the sixth embodiment, as described above, the capacitor 110 is formed in a region in a peripheral part on the n type epitaxial layer 102, and via the capacitor 110, the total capacitance (gate input capacitance) of the buried electrodes (gate electrodes) 105 can be reduced. Thus, by controlling the voltage applied to the buried electrodes (gate electrodes) 105, it is possible to quicken the on/off switching speed at the time of switching from an off state to an on state and switching in the opposite direction. That is, it is possible to quicken the switching speed.

In the sixth embodiment, as described above, when the channels 112 (the regions between mutually adjacent trenches 103) are stopped by all the depletion layers 113 formed around the plurality of trenches 103 respectively, the current passing through the channels 112 (the regions between mutually adjacent trenches 103) is cut off; on the other hand, when all the depletion layers 113 formed around the plurality of trenches 103 respectively are made to disappear, a current passes through the channels 112 (the regions between mutually adjacent trenches 103). With this configuration, how the depletion layers 113 formed around the trenches 103 are formed varies according to the voltage applied to the buried electrodes 105; thus, by controlling the voltage applied to the buried electrodes (gate electrodes) 105, it is possible to switch from an off state (a state in which the current passing through the channels 112 is cut off) to an on state (a state in which a current flows through the channels 112), and to switch in the opposite direction. That is, it is possible to give the semiconductor device 20 a switching function. With the configuration described above, in an on state, all the parts where the depletion layers 113 in the regions between mutually adjacent trenches 103 have disappeared can be utilized to function as channels 112, and accordingly, compared with conventional semiconductor switching devices (MOSFETs) in which a very thin inversion layer is utilized to function as a channel, it is possible to greatly reduce the resistance to the current passing through the channels 112. Thus, it is possible, while quickening the switching speed, to greatly reduce the on-state resistance compared with conventional semiconductor switching devices (MOSFETs). That is, it is possible, while quickening the switching speed, to greatly reduce the on-state resistance.

In the sixth embodiment, the interlayer insulation films 106 are formed inside the trenches 103 respectively in such a way that the top face of the interlayer insulation films 106 is flush with the top face of the n type epitaxial layer 102 (the top face of a top-end part of the regions between mutually adjacent trenches 103); thus, even when the interval (b) between mutually adjacent trenches 103 is reduced, it does not occur that a top-end part of the n type epitaxial layer 102 (a top-end part of the regions between mutually adjacent trenches 103) is covered by the interlayer insulation films 106. This makes it possible to reduce the interval (b) between mutually adjacent trenches 103, and thus makes it easy to join together the depletion layers 113 formed between mutually adjacent trenches 103.

In the sixth embodiment, the thickness of the dielectric layer 110a is made equal to or larger than the thickness of the silicon oxide film 104. With this configuration, it is possible to suppress dielectric breakdown in the dielectric layer 110a. Thus, even when the capacitor 110 is formed by the dielectric layer 110a laid between the lower and upper electrode layers 110b and 110c, it is possible to suppress the inconvenience of the semiconductor device 120 having lower withstand voltage characteristics resulting from dielectric breakdown in dielectric layer 110a.

Seventh Embodiment

Figure 27:
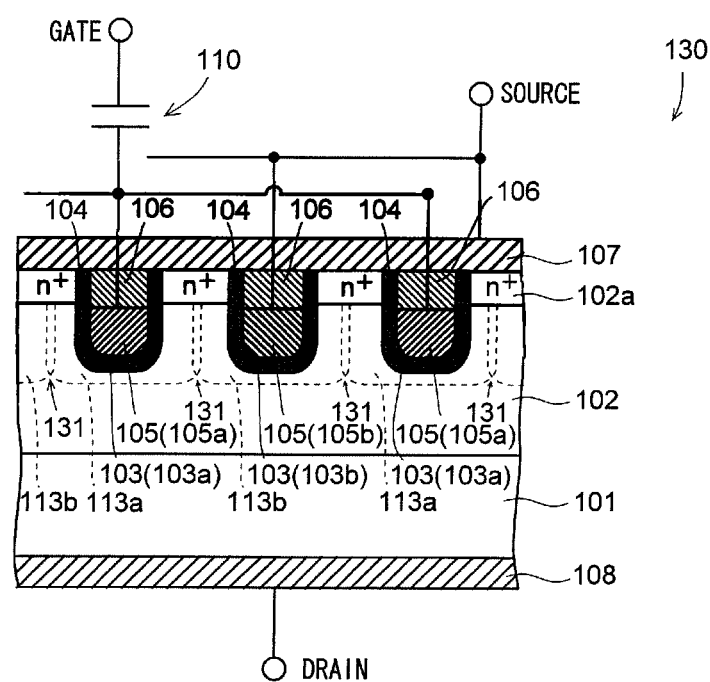
FIG. 27 A sectional view showing the structure of a semiconductor device according to a seventh embodiment of the invention.

FIG. 27 is a sectional view showing the structure of a semiconductor device according to a seventh embodiment of the invention. Next, with reference to FIG. 27, the structure of the semiconductor device 130 according to the seventh embodiment of the invention will be described.

In the semiconductor device 130 of the seventh embodiment, a plurality of buried electrodes 105 formed on the interior surface of a plurality of trenches 103 respectively are grouped into two types, a first and a second type, of buried electrodes 105a and 105b to which separate voltages are applied. The buried electrodes 105a of the first type are so configured that a voltage corresponding to a predetermined control signal (a signal for effecting switching between on and off) is applied to them via the capacitor 110. The buried electrodes 105b of the second type are electrically connected to a source electrode 107. That is, the buried electrodes 105b of the second type are so configured as to have an equal potential to the source electrode 107. The buried electrodes 105a and 105b are arranged alternately, one of one type next to one of the other type in direction A. Thus, between two buried electrodes 105a (or 105b) lies one buried electrode 105b (or 105a). It is to be understood that the buried electrodes 105a and 105b are an example of a "first buried electrode" and a "second buried electrode," respectively, according to the invention.

Both in a trench 103 in which a buried electrode 105a is buried (hereinafter referred to as a trench 103a) and in a trench 103 in which a buried electrode 105b is buried (hereinafter referred to as a trench 103b), in the remaining part of the trench other than the part where the buried electrode 105 is buried (the part above the buried electrode 105), a silicon oxide film is buried as an interlayer insulation film 106. Each of such interlayer insulation films 106 is given a thickness equal to the depth of the remaining part of the corresponding trench 103 other than the part where the buried electrode 105 is buried (the part above the buried electrode 105). Thus, the top face of each of the plurality of interlayer insulation films 106 is flush with the top face of the n type epitaxial layer 102 (the top face of a top-end part of the regions between mutually adjacent trenches 103).

In the seventh embodiment, when a voltage is applied between the source electrode 107 and the drain electrode 108, the current passing through the source electrode 107 and the drain electrode 108 passes through the regions between the trenches 103a and the adjacent trenches 103b. That is, in the seventh embodiment, the regions between the trenches 103a and the adjacent trenches 103b function as channels (current passages) 131 respectively.

In other respects, the semiconductor device 130 according to the seventh embodiment is structured similarly to the semiconductor device 120 according to the sixth embodiment described previously.

Figure 28:
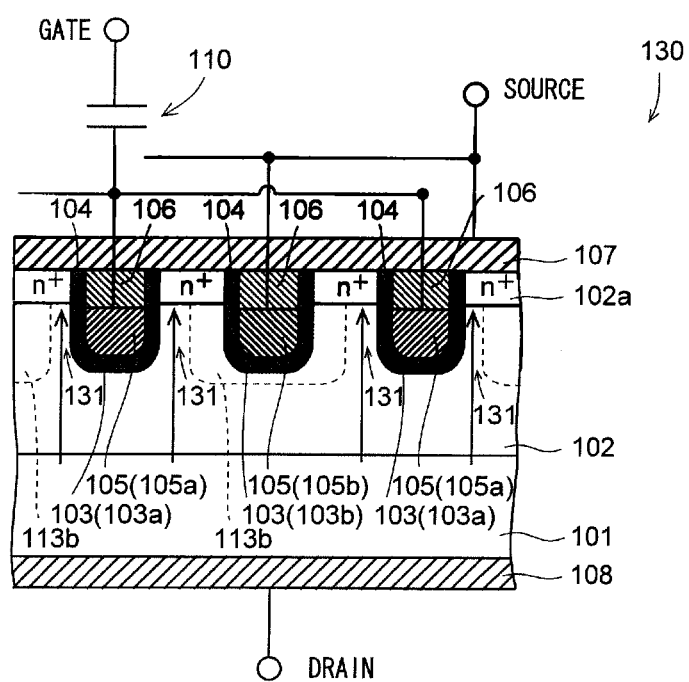
FIG. 28 A sectional view in illustration of the operation of the semiconductor device according to the seventh embodiment of the invention.

FIG. 28 is a sectional view in illustration of the operation of the semiconductor device according to the seventh embodiment of the invention. Next, with reference to FIGS. 27 and 28, the operation of the semiconductor device 130 according to the seventh embodiment of the invention will be described. In the following description of operation, it is assumed that a negative and a positive potential are applied to the source electrode 107 and the drain electrode 108 respectively.

In an off state, as shown in FIG. 27, the buried electrodes 105b are electrically connected to the source electrode 107, and thus a negative potential is applied to the buried electrodes 105b. Accordingly, around the trenches 103 (103b) having the buried electrodes 105b buried in them, a reduced number of majority carriers are present. That is, around the trenches 103b respectively, depletion layers 113 (113b) are formed irrespective of in an on or off state. Moreover, in an off state, the voltage applied to the buried electrodes 105a is so controlled as to reduce the number of majority carriers present around the trenches 103 (103a) having the buried electrodes 105a buried in them. Accordingly, also around the trenches 103a, depletion layers 113 (113a) are formed which are similar to the depletion layers 113 (113b) formed around the trenches 103b.

At this time, in the regions between the trenches 103a and 103b, the depletion layers 113a and 113b formed around the trenches 103a and 103b partly overlap with one another. That is, in the regions between the trenches 103a and 103b, the depletion layers 113a and 113b are joined together. Consequently, channels (current passages) 131 are stopped with the depletion layers 113a and 113b, and in this way the current passing through the channels (current passages) 131 can be cut-off. Accordingly, the semiconductor device 130 goes into an off state.

To switch from an off state to an on state, as shown in FIG. 28, a predetermined positive potential is applied to the buried electrodes 105a to make the depletion layers 113a (see FIG. 27) formed around the trenches 103a disappear. This enables a current to pass in the direction indicated by arrows in FIG. 28 through the buried electrode 105a (trench 103a)-side parts of the channels (current passages) 131, and in this way the semiconductor device 130 can be brought into an on state.

On the other hand, to switch the semiconductor device 130 from an on state to an off state, the predetermined positive potential stops being applied to the buried electrodes 105a. This restores the state shown in FIG. 27, and in this way the semiconductor device 130 can be brought into an off state.

The benefits of the seventh embodiment are similar to those of the sixth embodiment described previously.

Eighth Embodiment

Figure 29:
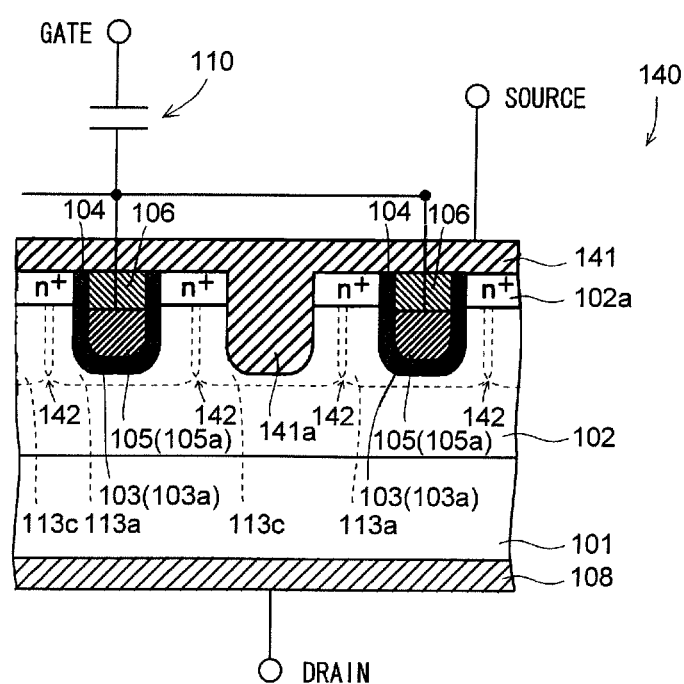
FIG. 29 A sectional view showing the structure of a semiconductor device according to an eighth embodiment of the invention.

FIG. 29 is a sectional view showing the structure of a semiconductor device according to an eighth seventh embodiment of the invention. Next, with reference to FIG. 29, the structure of the semiconductor device 140 according to the eighth embodiment of the invention will be described.

In the semiconductor device 140 according the eighth embodiment, there are provided, on one hand, trenches 103 (103a) in which buried electrodes 105 (105a) are buried to which a predetermined control signal (a signal for effecting switching between on and off) is applied via the capacitor 110 and, on the other hand, trenches 103 (103c) in which parts of a source electrode 141 (hereinafter referred to as the buried portions 141a) are buried. The trenches 103a and 103c are arranged alternately, one of one type next to one of the other type, at a predetermined interval from each other. Inside the trenches 103c, the buried portions 141a of the source electrode 141 make Schottky contact with an epitaxial layer 102. It is to be understood that the buried portions 141a of the source electrode 141 are an example of a "second buried electrode" according to the invention.

In the eighth embodiment, when a voltage is applied between the source electrode 141 and a drain electrode 108, the current that passes between the source electrode 141 and the drain electrode 108 passes through the regions between the trenches 103a and 103c. That is, in the eighth embodiment, the regions between the trenches 103a and 103c function as channels (current passages) 142 respectively.

In other respects, the semiconductor device 140 according to the eighth embodiment is structured similarly to the semiconductor device 120 according to the sixth embodiment described previously.

Figure 30:
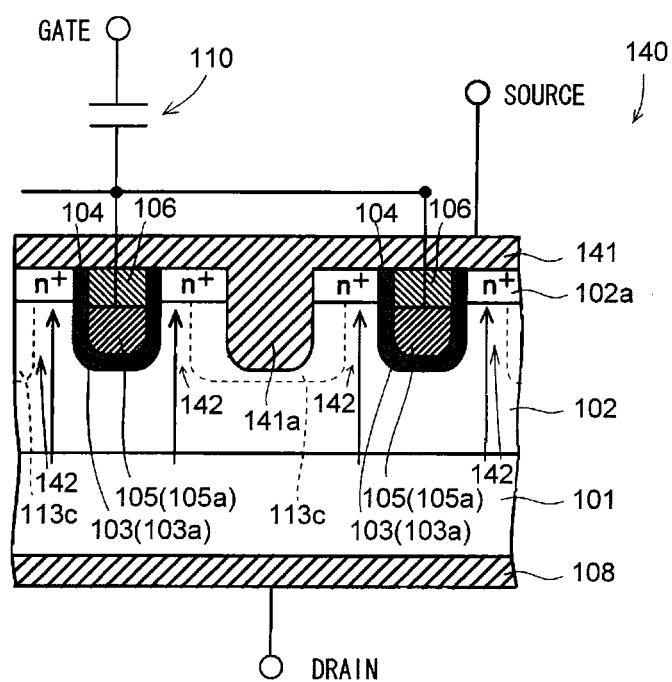
FIG. 30 A sectional view in illustration of the operation of the semiconductor device according to the eighth embodiment of the invention.

FIG. 30 is a sectional view in illustration of the operation of the semiconductor device according to the eighth embodiment of the invention. Next, with reference to FIGS. 29 and 30, the operation of the semiconductor device 140 according to the eighth embodiment of the invention will be described.

In the following description of operation, it is assumed that a negative and a positive potential are applied to the source electrode 141 and the drain electrode 108 respectively. Thus, around the trenches 103c having the buried portions 141a of the source electrode 141 buried in them, depletion layers 113 (113c) are formed irrespective of in an on or off state.

In an off state, as shown in FIG. 29, a negative potential is applied to the buried electrodes 105a so that depletion layers 113 (113a) are formed around the trenches 103a. As a result, the channels (current passages) 142 are stopped by the depletion layers 113a and 113c, and in this way the current passing through the channels (current passages) 142 can be cut off.

To switch from an off state to an on state, as shown in FIG. 29, a positive potential is applied to the buried electrodes 105a to make the depletion layers 113a shown in FIG. 29 disappear. This enables a current to pass in the direction indicated by arrows in FIG. 30 through the buried electrode 105a (trench 103a)-side parts of the channels (current passages) 142.

On the other hand, to switch the semiconductor device 140 from an on state to an off state, the predetermined positive potential stops being applied to the buried electrodes 105*a*. This restores the state shown in FIG. 29, and in this way the semiconductor device 140 can be brought into an off state.

The benefits of the eighth embodiment are similar to those of the sixth embodiment described previously.

Ninth Embodiment

Figure 31:
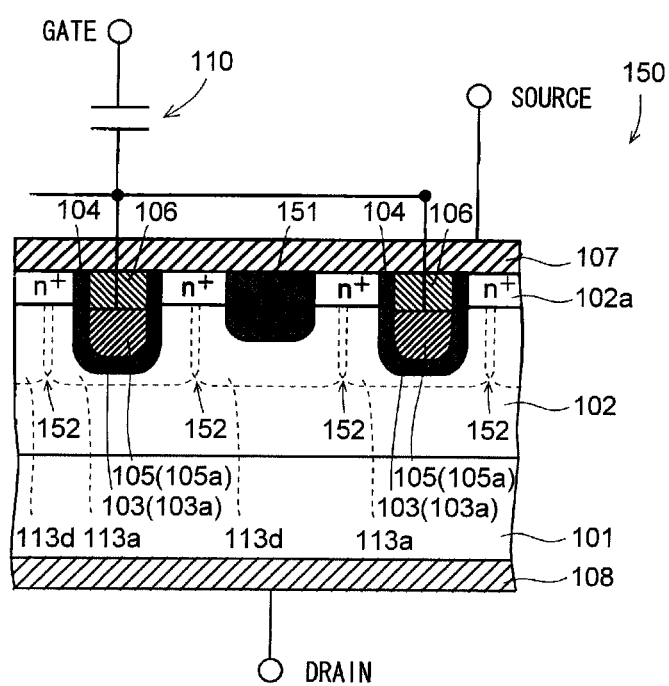
FIG. 31 A sectional view showing the structure of a semiconductor device according to a ninth embodiment of the invention.

FIG. 31 is a sectional view showing the structure of a semiconductor device according to a ninth embodiment of the invention. Next, with reference to FIG. 31, the structure of the semiconductor device 150 according to the ninth embodiment of the invention will be described.

In the semiconductor device 150 according to the ninth embodiment, there are provided, in addition to trenches 103 (103*a*) in which buried electrodes 105 (105*a*) are buried to which a predetermined control signal (for effecting switching between on and off) is applied via the capacitor 110, $p^+$ type diffusion regions 151 doped with a p type dopant at a high concentration. The $p^+$ type diffusion regions 151 are arranged in the regions between mutually adjacent trenches 103 (103*a*), at a predetermined interval from the trenches 103 (103*a*), one $p^+$ type diffusion region 151 next to one trench 103 (103*a*). The $p^+$ type diffusion regions 151 make ohmic contact with the source electrode 107. It is to be understood that the p+ type diffusion regions 151 are an example of a "diffusion region of an opposite conductivity type" according to the invention.

In the ninth embodiment, when a voltage is applied between the source electrode 107 and a drain electrode 108, the current that passes between the source electrode 107 and the drain electrode 108 passes through the regions between the trenches 103 (103*a*) and the $p^+$ type diffusion regions 151. That is, in the ninth embodiment, the regions between the trenches 103 (103*a*) and the $p^+$ type diffusion regions 151 function as channels (current passages) 152 respectively.

In other respects, the semiconductor device 150 according to the ninth embodiment is structured similarly to the semiconductor device 120 according to the sixth embodiment described previously.

Figure 32:
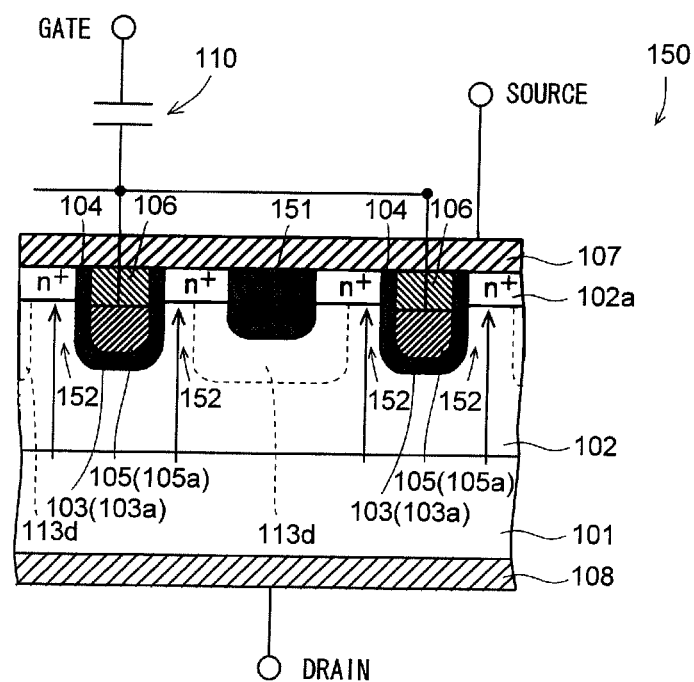
FIG. 32 A sectional view in illustration of the operation of the semiconductor device according to the ninth embodiment of the invention.
Figure 33:
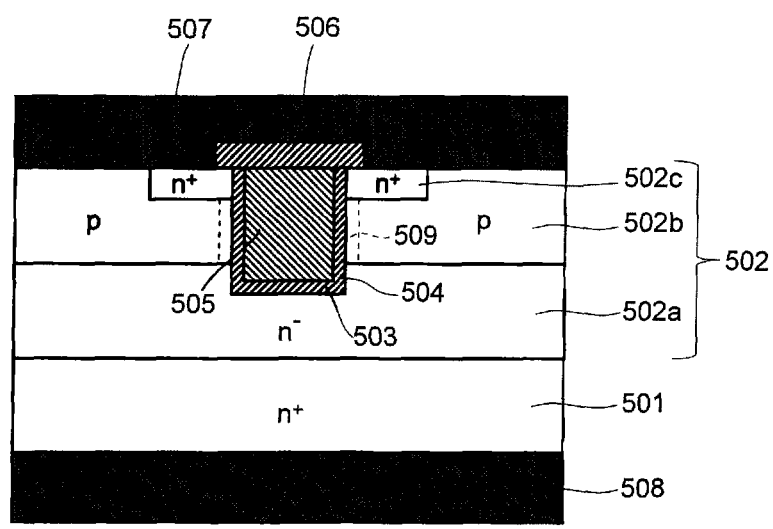
FIG. 33 A sectional view showing the structure of a conventional trench-gate type MOSFET described in Patent Document 1.

FIG. 32 is a sectional view in illustration of the operation of the semiconductor device according to the ninth embodiment of the invention. Next, with reference to FIGS. 31 and 32, the operation of the semiconductor device 150 according to the ninth embodiment of the invention will be described.

In the following description of operation, it is assumed that a negative and a positive potential are applied to the source electrode 107 and the drain electrode 108 respectively. Thus, around the $p^4$ type diffusion regions 151, depletion layers 113 (113*d*) are formed irrespective of in an on or off state.

In an off state, as shown in FIG. 31, a negative potential is applied to the buried electrodes 105*a* so that depletion layers 113 (113*a*) are formed around the trenches 103*a*. As a result, the channels (current passages) 152 are stopped by the depletion layers 113*a* and 113*d*, and in this way the current passing through the channels (current passages) 152 can be cut off.

To switch from an off state to an on state, as shown in FIG. 32, a positive potential is applied to the buried electrodes 105*a* to make the depletion layers 113*a* shown in FIG. 31 disappear. This enables a current to pass in the direction indicated by arrows in FIG. 32 through the buried electrode 105*a* (trench 103*a*)-side parts of the channels (current passages) 152.

On the other hand, to switch the semiconductor device 150 from an on state to an off state, the predetermined positive potential stops being applied to the buried electrodes 105*a*. This restores the state shown in FIG. 31, and in this way the semiconductor device 150 can be brought into an off state.

The benefits of the ninth embodiment are similar to those of the sixth embodiment described previously.

It should be understood that all the embodiments disclosed herein are in every aspect meant to be illustrative and not restrictive. The scope of the invention is defined not by the description of the embodiments presented above but by what is recited in the appended claims, and encompasses any modifications and variations made in a spirit and scope equivalent to those of the appended claims.

For example, although the first to ninth embodiments described above deal with examples in which trenches etc. are formed in an epitaxial layer formed on a silicon substrate, this is not meant to limit the invention; trenches etc. may instead be formed directly in a silicon substrate (semiconductor substrate) without forming an epitaxial layer on the silicon substrate (semiconductor substrate). It is also possible to form, first, trenches etc. in an epitaxial layer formed on a silicon substrate and then remove the silicon substrate by polishing or the like.

Although the first to ninth embodiments described above deal with examples in which the silicon substrate is of an $n^+$ type and the epitaxial layer formed on the top face of the silicon substrate is of an n type, this is not meant to limit the invention; the silicon substrate may be of a p type ($p^+$ type), and the epitaxial layer formed on the top face of the silicon substrate may be of the p type. That is, they may be of the opposite conductivity type compared with the semiconductor devices according to the embodiments described above.

Although the first to ninth embodiments described above deal with examples in which the buried electrodes are formed of p type polysilicon, this is not meant to limit the invention; instead of p type polysilicon, a metal or the like may be used. Examples of metal materials that can be used for the buried electrodes include: aluminum (Al), copper (Cu), tungsten (W), titanium (Ti), nickel (Ni), molybdenum (Mo), cobalt (Co), silver (Ag), platinum (Pt), and lead (Pb). One or more of these metal materials may be used in combination. Polysilicon may be mixed with a metal material.

Although the first to ninth embodiments described above deal with examples in which the interlayer insulation films formed on the top face of the buried electrodes are so formed that their top face is flush with the top face of the epitaxial layer, this is not meant to limit the invention; instead, the interlayer insulation films formed on the top face of the buried electrodes may be so formed that their top face protrudes from the top face of the epitaxial layer, or that their top face lies below (on the trenches' interior side of) the top face of the epitaxial layer.

Although the first to ninth embodiments described above deal with examples in which the trenches are given a depth smaller than the thickness of the n type epitaxial layer, this is not meant to limit the invention; instead, the trenches may be so formed as to penetrate the n type epitaxial layer and reach the $n^+$ type silicon substrate. Specifically, the trenches may be given a depth of about 12 µm.

Although the first to fifth embodiments described above deal with examples in which the metal layers are given a width smaller than the width of the buried electrodes, this is not meant to limit the invention; instead, the metal layers may be given a width equal to the width of the buried electrodes.

Although the first to fifth embodiments described above deal with examples in which the metal layers are formed of W (tungsten), this is not meant to limit the invention; they may instead be formed of a conductive material other than W (tungsten). For example, the metal layers may be formed of Ti (titanium), or out of a material having a layered structure of Ti and TiN. It is possible even to form, instead of the metal layers, conductor layers of conductive polysilicon or the like inside the trenches.

Although the first to fifth embodiments described above deal with examples in which the metal layers are formed inside the plurality of trenches respectively, this is not meant to limit the invention; the metal layers need not be formed inside all of the plurality of trenches.

Although the sixth to ninth embodiments described above deal with examples in which the invention is applied to a semiconductor device based on a novel operation principle which is so configured that, as a result of the regions (channels) between mutually adjacent trenches being stopped by depletion layers, the current passing through the channels is cut off and that, as a result of the depletion layer being made to disappear, a current passes through the channels, this is not meant to limit the invention; the invention may be applied to a semiconductor device which is so configured that a current passes through a depletion layer. For example, in conventional trench-gate type MOSFETs or the like, a capacitor connected in series with a gate electrode may be formed. With this configuration also, it is possible to reduce the gate input capacitance of the semiconductor device (MOSFET), and thus it is possible to quicken the switching speed of the semiconductor device (MOSFET).

Although the sixth to ninth embodiments described above deal with examples in which $SiO_2$ is used for the dielectric layer included in the capacitor formed on the top face of the n type epitaxial layer, this is not meant to limit the invention; an insulating material other than $SiO_2$ may instead be used for the dielectric layer included in the capacitor. For example, SiN may be used for the dielectric layer.

Although the sixth to ninth embodiments described above deal with examples in which polysilicon made conductive is used for each of the upper and lower electrode layers included in the capacitor formed on the top face of the n type epitaxial layer, this is not meant to limit the invention; a conductive material other than polysilicon may instead be used for the upper and lower electrode layers. For example, a metal material may be used for the upper and lower electrode layers.

Although the sixth to ninth embodiments described above deal with examples in which the capacitor composed of the dielectric layer laid between the upper and lower electrode layers is formed in a region in a peripheral part on the n type epitaxial layer so as to surround the source electrode, this is not meant to limit the invention; the capacitor may instead be formed in a region other than in a peripheral part on the n type epitaxial layer.

Although the sixth to ninth embodiments described above deal with examples in which one capacitor connected in series with the buried electrodes is formed by forming the lower electrode layer, the dielectric layer, and the upper electrode layer successively in this order from the side of the insulation/separation film formed on the top face of the n type epitaxial layer, this is not meant to limit the invention; instead, a plurality of capacitors may be formed by forming a plurality of electrode layers and a plurality of dielectric layers alternately from the insulation/separation film side.

What is claimed is:

1. A semiconductor device comprising:
   a first semiconductor layer of one conductivity type having a plurality of trenches arranged at a predetermined interval from one another, and having a predetermined depth and width;
   a second semiconductor layer of the one conductivity type having a higher concentration than the first semiconductor layer and arranged between mutually adjacent ones of the trenches at a top face of the first semiconductor layer;
   a plurality of buried electrodes buried in the plurality of trenches respectively; and
   a plurality of conductor layers inside the plurality of trenches, each of the conductor layers being arranged above a respective one of the buried electrodes with a first insulation film interposed in between so that each of the conductor layers is capacitively coupled to the respective one of the buried electrodes, and each of the plurality of buried electrodes is on a respective interior surface of one of the trenches with another insulation film interposed in between, a thickness of the first insulation film being larger than a thickness of the other insulation film,
   wherein the plurality of buried electrodes are gate electrodes,
   wherein, in the first semiconductor layer, regions, which extend between mutually adjacent ones of the plurality of trenches and which function as current passages, are switched between a conducting state and a cut-off state as a voltage applied to the plurality of conductor layers that are connected together to control the plurality of buried electrodes is controlled, and
   wherein a width of each of the plurality of conductor layers in a direction of arrangement of the trenches is smaller than a width of the plurality of buried electrodes.

2. The semiconductor device of claim 1, wherein the plurality of conductor layers are formed one inside each of the plurality of trenches and are capacitively coupled to the plurality of buried electrodes respectively.

3. The semiconductor device of claim 1, wherein
   a further insulation film is on a top face of the conductor layers, and
   the further insulation film is inside the trenches such that a top face of the further insulation film is flush with a top face of the second semiconductor layer.

4. The semiconductor device of claim 1, wherein the plurality of conductor layers are formed of a metal material.

5. The semiconductor device of claim 4, wherein the plurality of conductor layers comprise at least one metal material selected from the group of W, Ti, and TiN.

6. The semiconductor device of claim 1, wherein each of the plurality of trenches is in an elongate shape so as to extend parallel to one another in a direction parallel to the top face of the first semiconductor layer and perpendicular to a direction of arrangement of the trenches.

7. The semiconductor device of claim 1, wherein the width of the plurality of trenches is greater than the predetermined interval.

8. The semiconductor device of claim 1, wherein the semiconductor device is arranged to operate such that, in the first semiconductor layer, when the voltage applied to the plurality of conductor layers to control the plurality of buried electrodes is turned to an off potential, depletion layers formed around the plurality of trenches make the regions that extend from each trench to one or more mutually adjacent ones of the trenches non-conducting so that the current passages are cut off, and when the voltage applied to the plurality of conductor layers to control the plurality of buried electrodes is turned to an on potential, at least part of the depletion layers formed around the trenches disappears so that the current passages are opened.

* * * * *